United States Patent
Kim et al.

(10) Patent No.: US 10,910,396 B2
(45) Date of Patent: Feb. 2, 2021

(54) THREE-DIMENSIONAL SEMICONDUCTOR MEMORY DEVICES

(71) Applicant: Samsung Electronics Co., Ltd., Suwon-si (KR)

(72) Inventors: Junhyoung Kim, Seoul (KR); Geunwon Lim, Yongin-si (KR); Kwang-soo Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/444,716

(22) Filed: Jun. 18, 2019

(65) Prior Publication Data

US 2020/0194448 A1 Jun. 18, 2020

(30) Foreign Application Priority Data

Dec. 13, 2018 (KR) .................. 10-2018-0161076

(51) Int. Cl.
| | |
|---|---|
| *H01L 27/11575* | (2017.01) |
| *H01L 23/522* | (2006.01) |
| *H01L 27/11565* | (2017.01) |
| *H01L 27/11582* | (2017.01) |

(52) U.S. Cl.
CPC .... *H01L 27/11575* (2013.01); *H01L 23/5226* (2013.01); *H01L 27/11565* (2013.01); *H01L 27/11582* (2013.01)

(58) Field of Classification Search
CPC ......... H01L 27/11575; H01L 27/11565; H01L 27/11582; H01L 23/5226
See application file for complete search history.

(56) References Cited

U.S. PATENT DOCUMENTS

| | | | |
|---|---|---|---|
| 9,000,563 B2 | 4/2015 | Park et al. | |
| 9,601,577 B1* | 3/2017 | Lee .................. | H01L 21/823462 |
| 9,659,954 B2 | 5/2017 | Kim et al. | |
| 10,026,747 B2 | 7/2018 | Hwang et al. | |
| 2016/0163732 A1* | 6/2016 | Lim .................. | H01L 27/11582 257/314 |
| 2016/0293539 A1* | 10/2016 | Park .................. | H01L 27/11548 |
| 2017/0200676 A1* | 7/2017 | Jeong ................ | H01L 21/76816 |
| 2018/0082750 A1 | 3/2018 | Ikeda et al. | |
| 2018/0197869 A1 | 7/2018 | Chavan et al. | |
| 2019/0013206 A1 | 1/2019 | Park et al. | |

FOREIGN PATENT DOCUMENTS

| | | |
|---|---|---|
| KR | 10-2011-0013701 A | 2/2011 |
| KR | 10-2019-0005574 A | 1/2019 |

* cited by examiner

*Primary Examiner* — Marc Anthony Armand
(74) *Attorney, Agent, or Firm* — Harness, Dickey and Pierce, P.L.C.

(57) ABSTRACT

A three-dimensional semiconductor memory device includes a plurality of first insulating layers vertically stacked on a peripheral logic structure, second insulating layers stacked alternately with the first insulating layers, conductive layers stacked alternately with the first insulating layers and disposed on sidewalls of the second insulating layers, through-interconnections penetrating the first insulating layers and the second insulating layers so as to be connected to the peripheral logic structure, and a first conductive line electrically connected to a plurality of first conductive layers of the conductive layers.

19 Claims, 19 Drawing Sheets

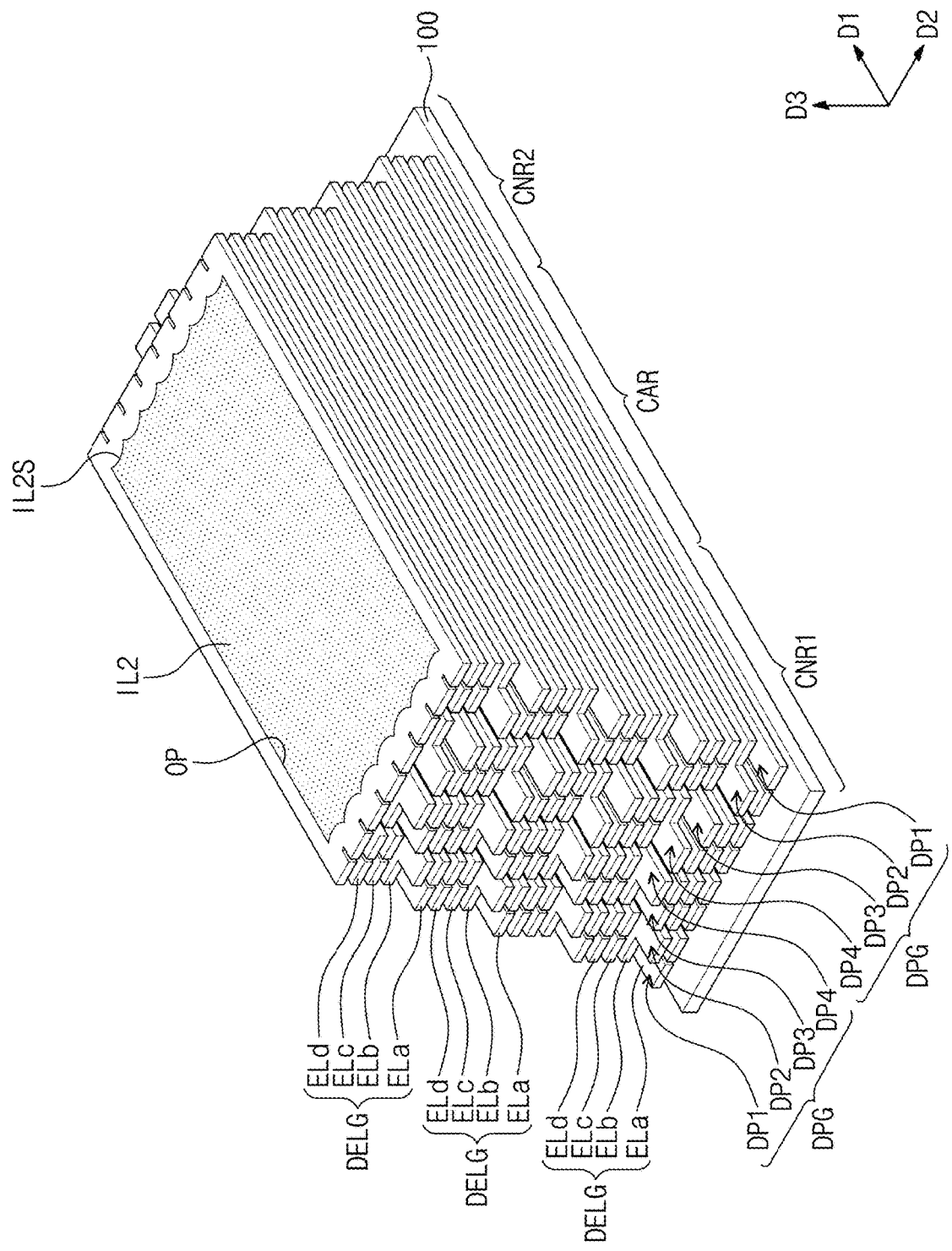

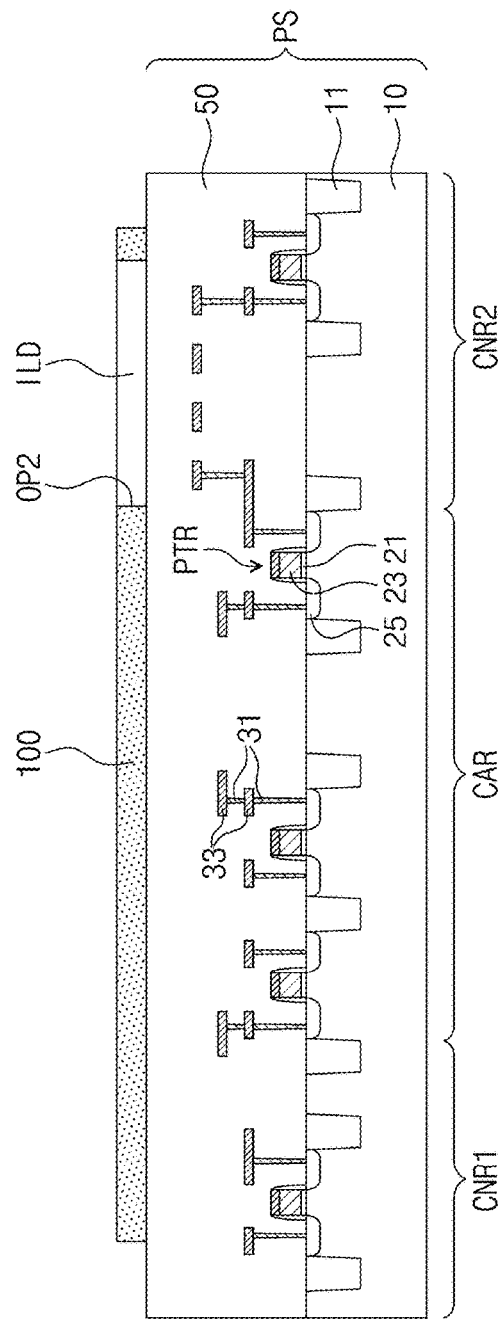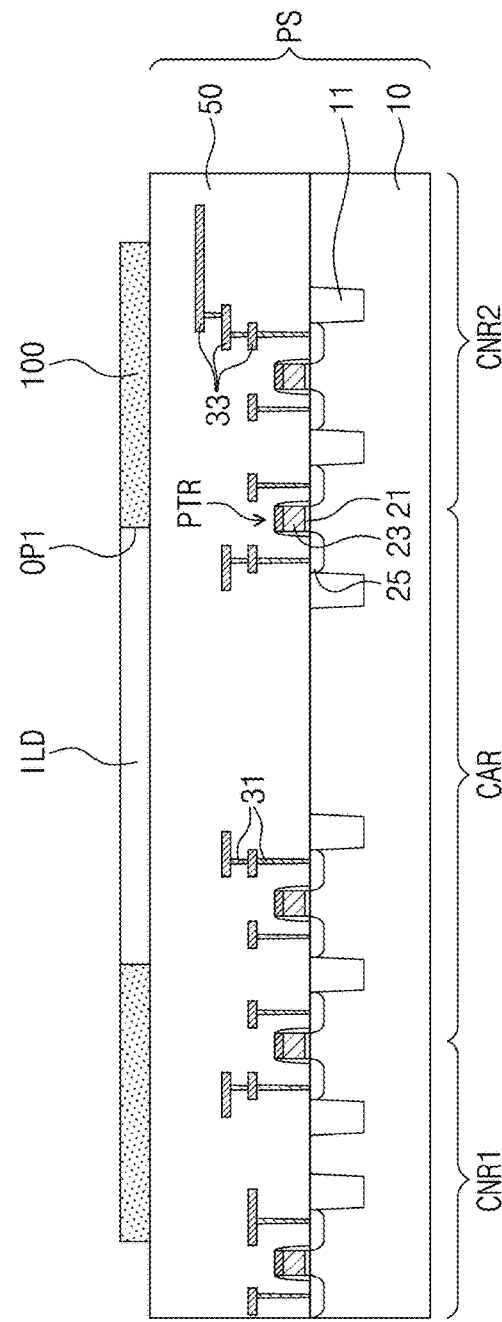

US 10,910,396 B2

THREE-DIMENSIONAL SEMICONDUCTOR MEMORY DEVICES

CROSS-REFERENCE TO RELATED APPLICATION

This U.S. non-provisional patent application claims priority under 35 U.S.C. § 119 to Korean Patent Application No. 10-2018-0161076, filed on Dec. 13, 2018, in the Korean Intellectual Property Office, the disclosure of which is hereby incorporated by reference in its entirety.

BACKGROUND

Example embodiments of the inventive concepts relate to a three-dimensional (3D) semiconductor memory device. For example, at least some example embodiments relate to 3D semiconductor memory devices including capacitors.

Semiconductor devices have been highly integrated to provide excellent performance and low manufacture costs. The integration density of semiconductor devices directly affects the costs of the semiconductor devices, thereby resulting in a demand of highly integrated semiconductor devices. The integration density of two-dimensional (2D) or planar semiconductor devices may be mainly determined by an area occupied by a unit memory cell. Therefore, the integration density of the 2D or planar semiconductor devices may be affected by a technique of forming fine patterns. However, since extremely high-priced apparatuses may be used to form fine patterns, the integration density of 2D semiconductor devices continues to increase but is still limited. Thus, three-dimensional (3D) semiconductor memory devices have been developed to overcome the above limitations. 3D semiconductor memory devices may include memory cells three-dimensionally arranged.

SUMMARY

Example embodiments of the inventive concepts may provide three-dimensional (3D) semiconductor memory devices capable of improving an integration density.

In some example embodiments, a 3D semiconductor memory device may include first insulating layers vertically stacked on a peripheral logic structure; second insulating layers stacked alternately with the first insulating layers; conductive layers stacked alternately with the first insulating layers such that the conductive layers are on sidewalls of the second insulating layers; through-interconnections penetrating the first insulating layers and the second insulating layers such that the through-interconnections are connected to the peripheral logic structure; and a first conductive line electrically connected to a plurality of first conductive layers of the conductive layers.

In some example embodiments, a 3D semiconductor memory device may include a peripheral logic structure on a substrate; a horizontal semiconductor layer on the peripheral logic structure, the horizontal semiconductor layer including a first connection region, a second connection region and a cell array region, the cell array region between the first connection region and the second connection region; first insulating layers vertically stacked on the horizontal semiconductor layer; second insulating layers stacked alternately with the first insulating layers on the cell array region; conductive layers stacked alternately with the first insulating layers on the first connection region and the second connection region; a conductive line on the first connection region; and a plurality of conductive plugs electrically connecting the conductive line and the conductive layers.

In some example embodiments, a 3D semiconductor memory device may include a horizontal semiconductor layer on a peripheral logic structure, the horizontal semiconductor layer including first and second connection regions and a cell array region between the first and second connection regions; first and second stack structures on the horizontal semiconductor layer; a dummy stack structure between the first and second stack structures, the dummy stack structure including dummy electrode layers vertically stacked; vertical channel structures penetrating the first and second stack structures on the cell array region such that the vertical channel structures are connected to the horizontal semiconductor layer; first through-interconnections penetrating the dummy stack structure on the cell array region such that the first through-interconnections are connected to the peripheral logic structure; and a conductive line electrically connected to a plurality of first dummy electrode layers of the dummy electrode layers.

BRIEF DESCRIPTION OF THE DRAWINGS

Example embodiments of the inventive concepts will become more apparent in view of the attached drawings and accompanying detailed description.

FIG. 6B is a perspective view illustrating some components of a dummy stack structure.

FIGS. 8A, 9A, 10A, 11A and 12A are cross-sectional views corresponding to the line I-I' of FIG. 4 to illustrate a method of manufacturing a 3D semiconductor memory device according to some example embodiments of the inventive concepts.

FIGS. 8B, 9B, 10B, 11B and 12B are cross-sectional views corresponding to the line III-III' of FIG. 4 to illustrate a method of manufacturing a 3D semiconductor memory device according to some example embodiments of the inventive concepts.

DETAILED DESCRIPTION

Example embodiments of the inventive concepts will be described hereinafter in detail with reference to the accompanying drawings.

Figure 1:
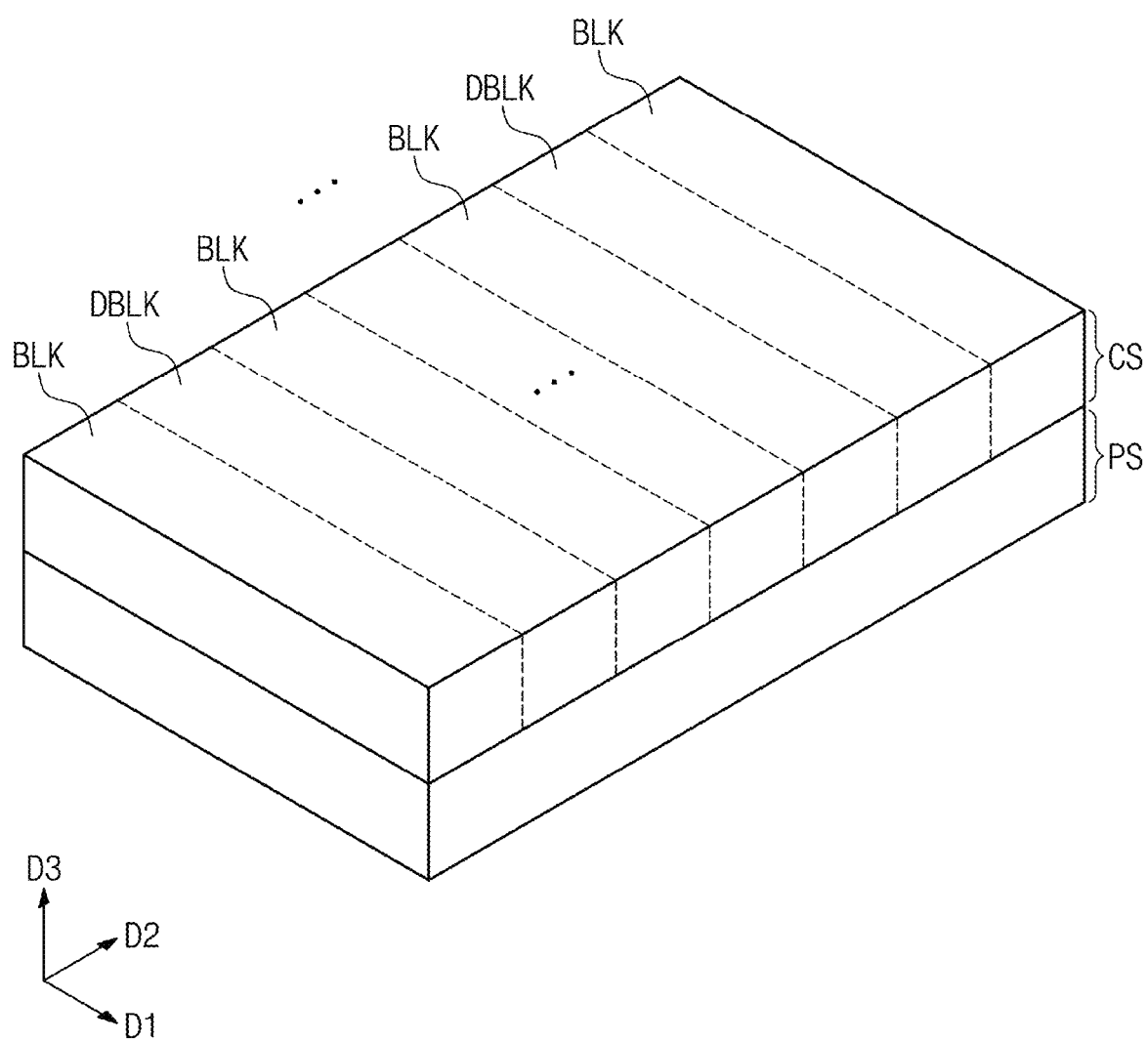
FIG. 1 is a perspective view schematically illustrating a three-dimensional (3D) semiconductor memory device according to some example embodiments of the inventive concepts.
Figure 2:
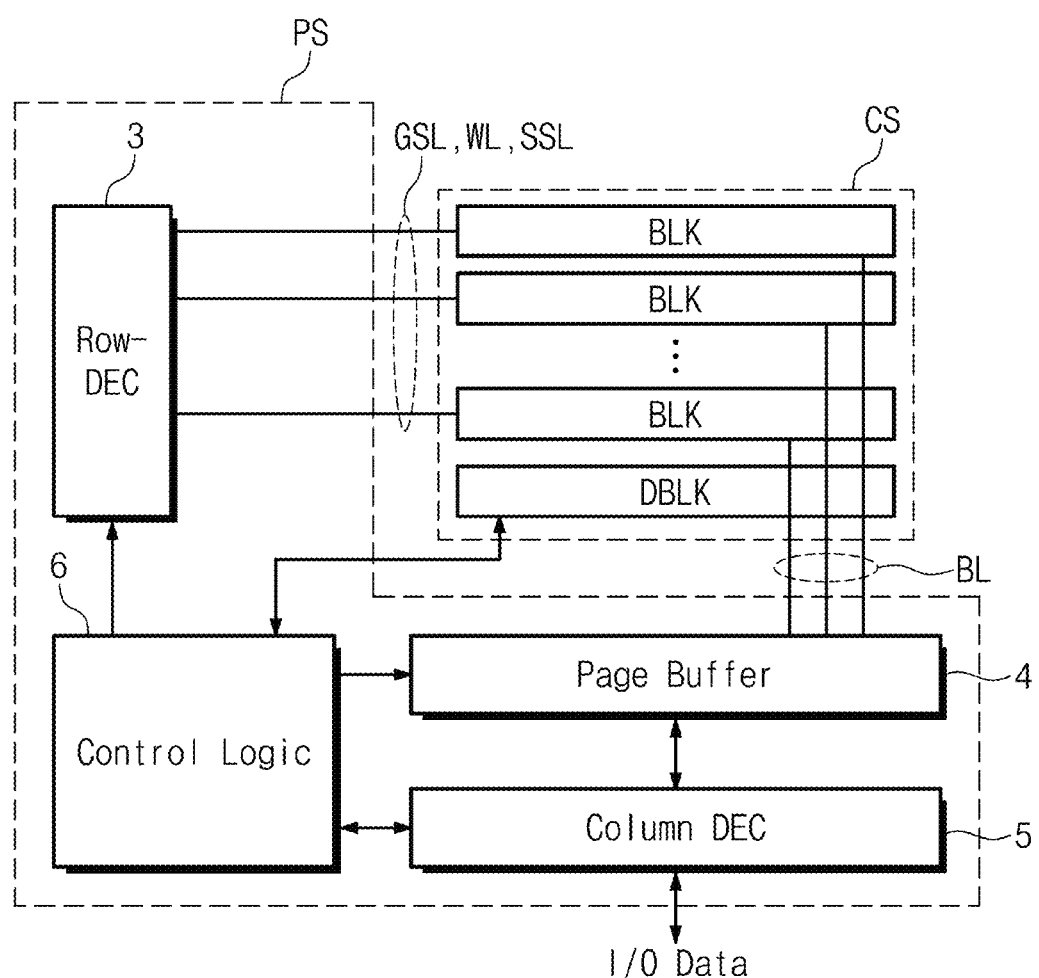
FIG. 2 is a block diagram illustrating a 3D semiconductor memory device according to some example embodiments of the inventive concepts.

FIG. 1 is a perspective view schematically illustrating a three-dimensional (3D) semiconductor memory device according to some example embodiments of the inventive concepts. FIG. 2 is a block diagram illustrating a 3D semiconductor memory device according to some example embodiments of the inventive concepts.

Referring to FIGS. 1 and 2, a 3D semiconductor memory device may include a peripheral logic structure PS and a cell array structure CS. The cell array structure CS may be stacked on the peripheral logic structure PS. In other words, the cell array structure CS may overlap with the peripheral logic structure PS when viewed in a plan view.

The cell array structure CS may include memory blocks BLK and dummy blocks DBLK disposed between the memory blocks BLK. Each of the memory blocks BLK may include a memory cell array having a three-dimensional (3D) structure. The memory cell array may include a plurality of cell strings formed in a NAND type. Each of the memory blocks BLK may be a unit in which an erase operation is performed on the cell strings storing data.

The dummy blocks DBLK may include through-interconnection regions for connecting the cell strings in the memory blocks BLK to the peripheral logic structure PS. The through-interconnection region may be formed adjacent to the cell strings in the memory blocks BLK adjacent thereto. In addition, the dummy blocks DBLK may include capacitors connected to the peripheral logic structure PS.

The peripheral logic structure PS may include a row decoder 3, a page buffer 4, a column decoder 5, and a control logic circuit 6. The row decoder 3 may be connected to the memory blocks BLK through ground selection lines GSL, word lines WL, and string selection lines SSL. The row decoder 3 may operate depending on control of the control logic circuit 6. The row decoder 3 may decode an address signal received from the control logic circuit 6 and may control voltages, applied to the string selection lines SSL, the word lines WL and the ground selection lines GSL, on the basis of the decoded address signal.

The page buffer 4 may be connected to the memory blocks BLK through bit lines BL. The page buffer 4 may operate depending on control of the control logic circuit 6. In a write operation, the page buffer 4 may store data to be programmed in memory cells. The page buffer 4 may apply voltages to the bit lines BL on the basis of the stored data. In a read operation or verification read operation, the page buffer 4 may sense voltages of the bit lines BL and may store sensed results.

The column decoder 5 may decode an address signal inputted from an external system to select one among the bit lines BL. The column decoder 5 may provide a data transmission path between the page buffer 4 and an external device (e.g., a memory controller).

The control logic circuit 6 may be supplied with a power voltage and may control the row decoder 3, the page buffer 4, and the column decoder 5. The control logic circuit 6 may be connected to the capacitors in the dummy block DBLK and thus may control a level of a voltage required for driving the 3D semiconductor memory device. The control logic circuit 6 may include a voltage generator. The voltage generator may generate voltages (e.g., a program voltage, a read voltage, and/or an erase voltage) required for operating the memory cell arrays of the memory blocks BLK. The capacitors in the dummy block DBLK may be connected to, for example, the voltage generator.

Figure 3:
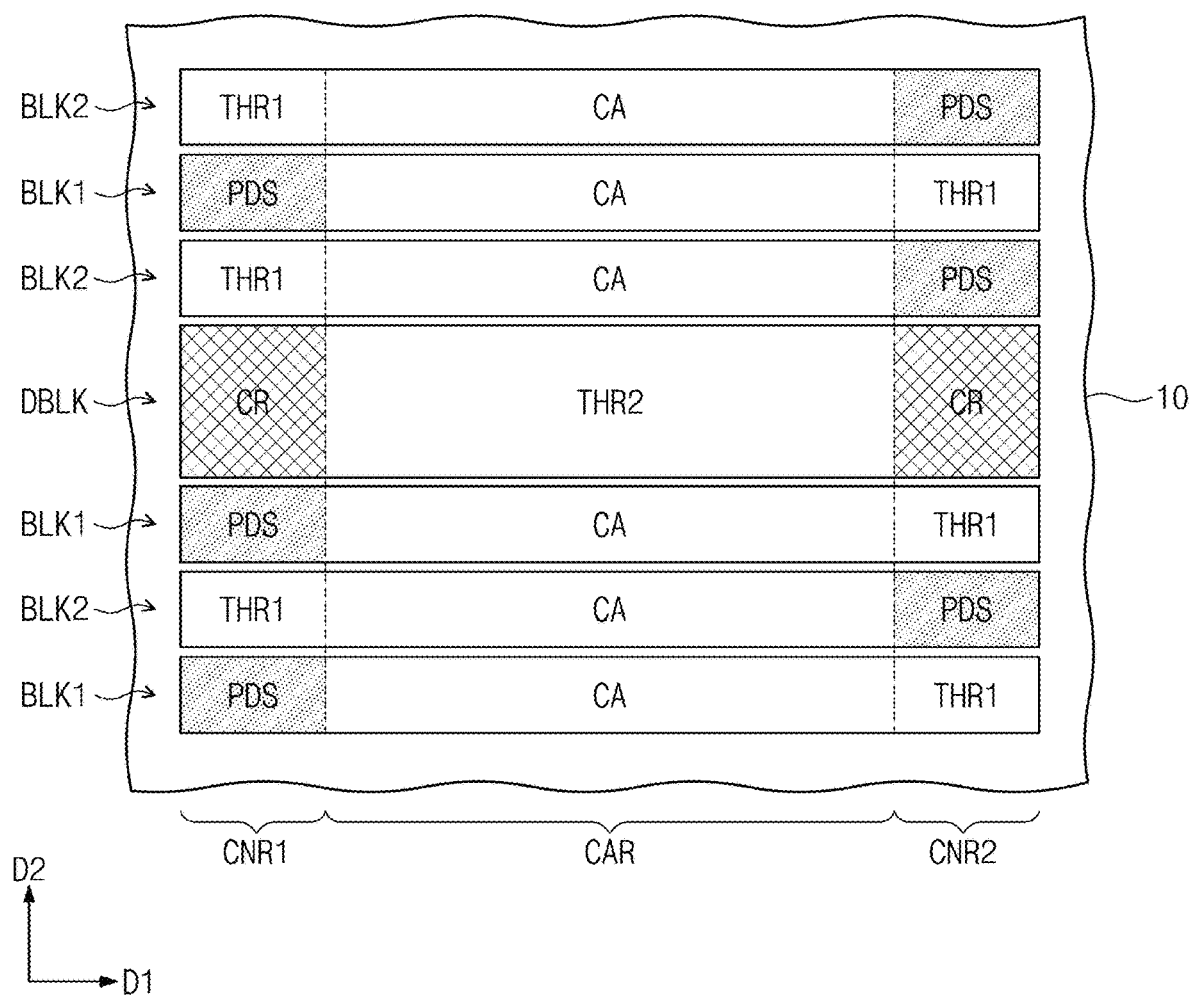
FIG. 3 is a schematic block diagram illustrating a 3D semiconductor memory device according to some example embodiments of the inventive concepts.

FIG. 3 is a schematic block diagram illustrating a 3D semiconductor memory device according to some example embodiments of the inventive concepts.

Referring to FIGS. 2 and 3, the 3D semiconductor memory device may include a plurality of memory blocks BLK1 and BLK2 and a dummy block DBLK between the memory blocks BLK1 and BLK2. The memory blocks BLK1 and BLK2 and the dummy block DBLK may extend in a first direction D1 and may be arranged in a second direction D2 perpendicular to the first direction D1. The memory blocks BLK1 and BLK2 and the dummy block DBLK may be disposed on a substrate 10 including a cell array region CAR, a first connection region CNR1, and a second connection region CNR2. The cell array region CAR may be disposed between the first connection region CNR1 and the second connection region CNR2.

The memory blocks BLK1 and BLK2 may include memory cell arrays CA formed on the cell array region CAR. In other words, the cell array region CAR may be a region on which the memory cell arrays CA of the memory blocks BLK1 and BLK2 are formed.

Each of the memory blocks BLK1 and BLK2 may include a pad region PDS formed on one of the first connection region CNR1 and the second connection region CNR2. The pad region PDS may be a region for connecting electrodes used as the word lines of the 3D semiconductor memory device to the row decoder 3. A stair structure may be formed in the pad region PDS.

In some example embodiments, the memory blocks BLK1 and BLK2 may include first memory blocks BLK1 and second memory blocks BLK2. The first memory blocks BLK1 may include the pad regions PDS disposed on the first connection region CNR1, and the second memory blocks BLK2 may include the pad regions PDS disposed on the second connection region CNR2. The first memory blocks BLK1 and the second memory blocks BLK2 may be alternately arranged in the second direction D2. In other words, the pad regions PDS of the memory blocks BLK1 and BLK2 adjacent to each other may be formed on the first connection region CNR1 and the second connection region CNR2, respectively.

Each of the memory blocks BLK1 and BLK2 may include a first through-interconnection region THR1 opposite to the pad region PDS. In other words, the first memory blocks BLK1 may include the first through-interconnection regions THR1 disposed on the second connection region CNR2, and the second memory blocks BLK2 may include the first through-interconnection regions THR1 disposed on the first connection region CNR1. The first through-interconnection region THR1 may be a region in which first through-interconnections PLGa (see FIGS. 5A and 5B) penetrating the memory block BLK1 or BLK2 so as to be connected to the peripheral logic structure PS are disposed. The first through-interconnections PLGa may electrically connect the pad region PDS and the row decoder 3.

The dummy block DBLK may include a second through-interconnection region THR2 formed on the cell array region CAR. The second through-interconnection region THR2 may be a region in which second through-interconnections PLGb (see FIG. 5C) penetrating the dummy block DBLK so as to be connected to the peripheral logic structure PS are formed. The second through-interconnections PLGb may electrically connect the page buffer 4 to the bit lines BL connected to the memory cell arrays CA of the memory blocks.

The dummy block DBLK may include a capacitor structure CR formed on the first and second connection regions CNR1 and CNR2. In some example embodiments, the capacitor structure CR may be a power capacitor for filtering noise existing in power and ground voltages provided in operation of the 3D semiconductor memory device. In certain embodiments, the capacitor structure CR may be a pump capacitor for changing or converting a voltage applied into the peripheral logic structure PS.

Figure 4:
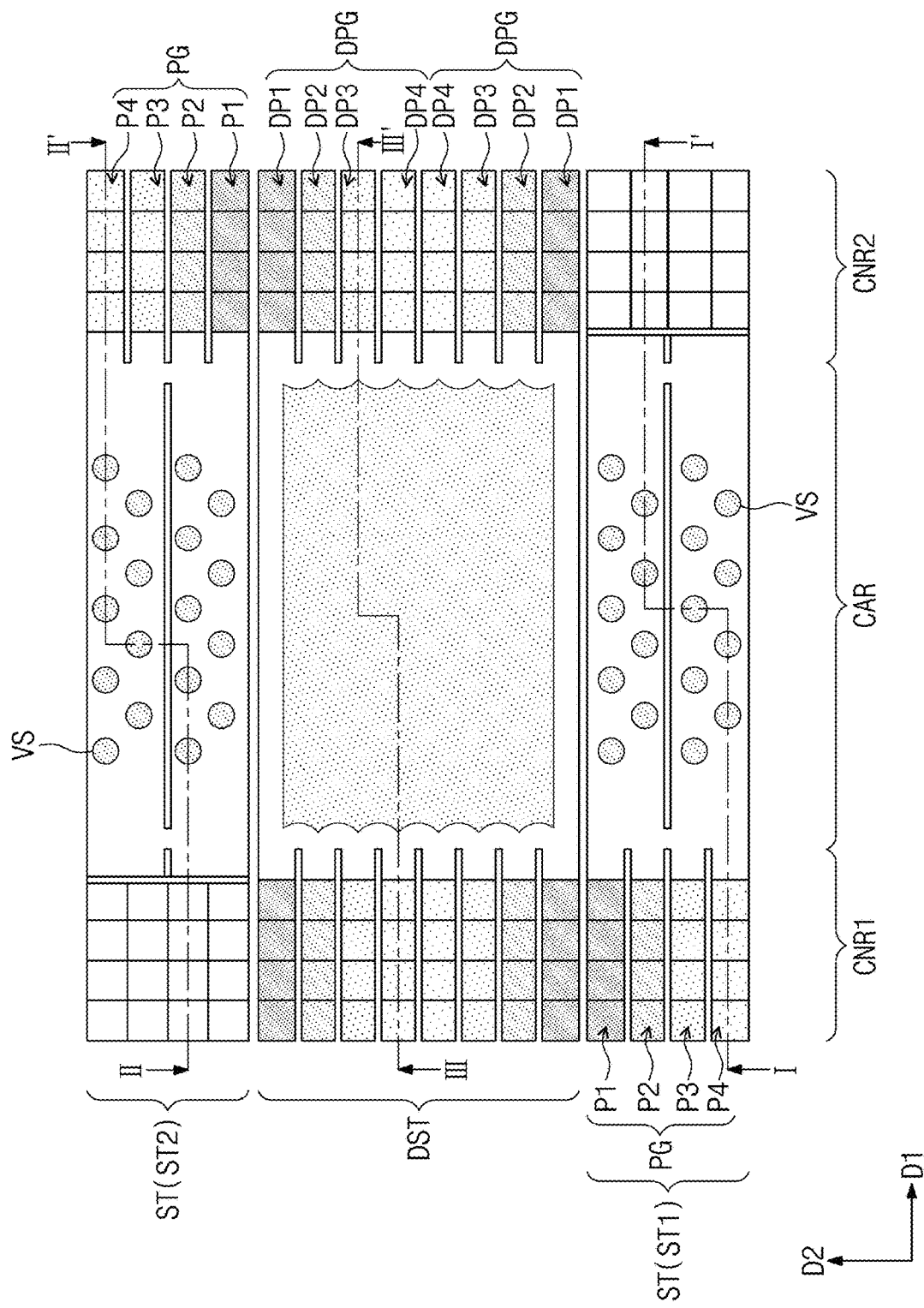
FIG. 4 is a schematic plan view illustrating a 3D semiconductor memory device according to some example embodiments of the inventive concepts.
Figure 5A:
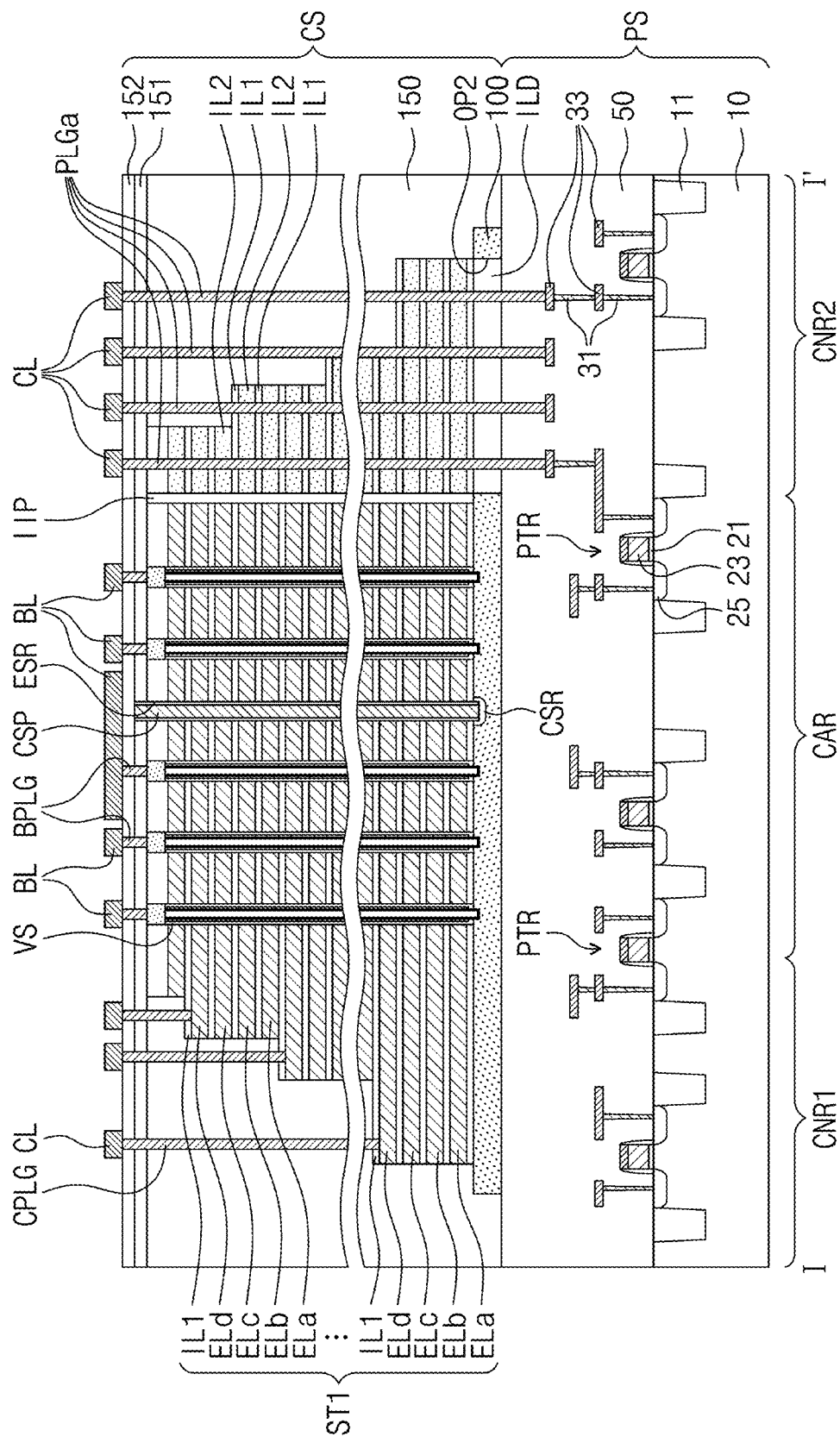
FIGS. 5A, 5B and 5C are cross-sectional views taken along lines I-I', II-II' and III-III' of FIG. 4, respectively, to illustrate a 3D semiconductor memory device according to some example embodiments of the inventive concepts.
Figure 5B:
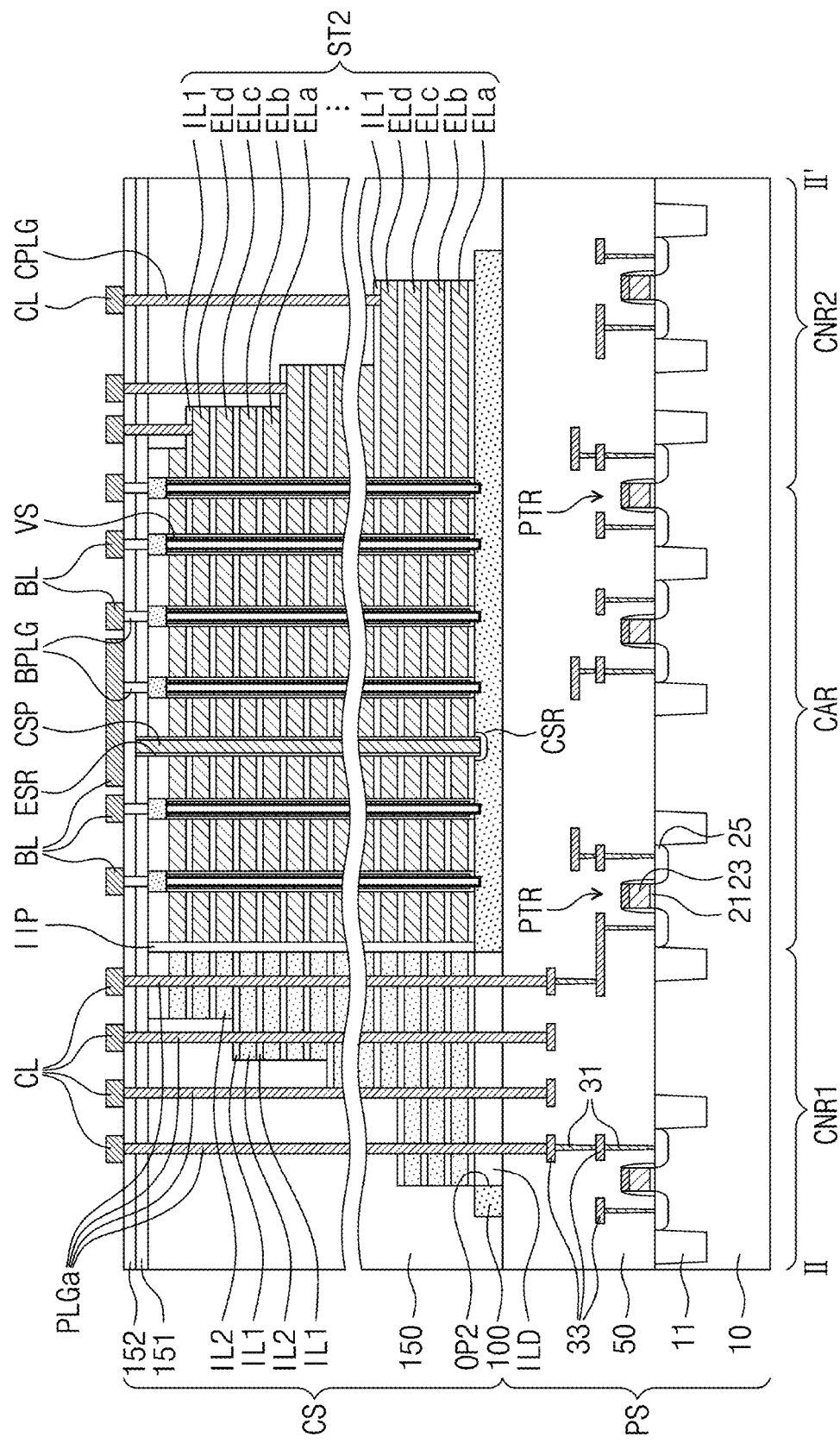
Figure 5C:
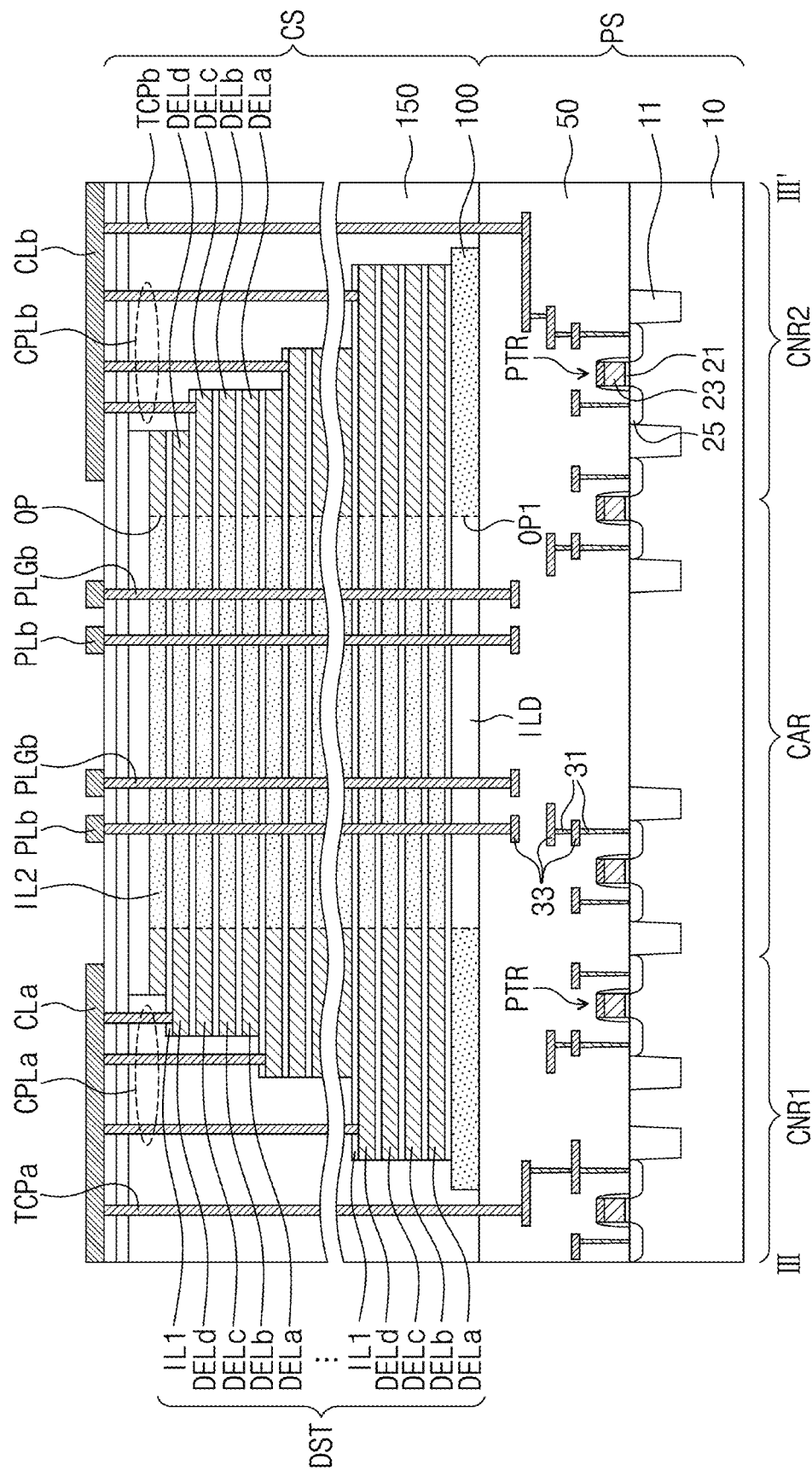
Figure 6A:
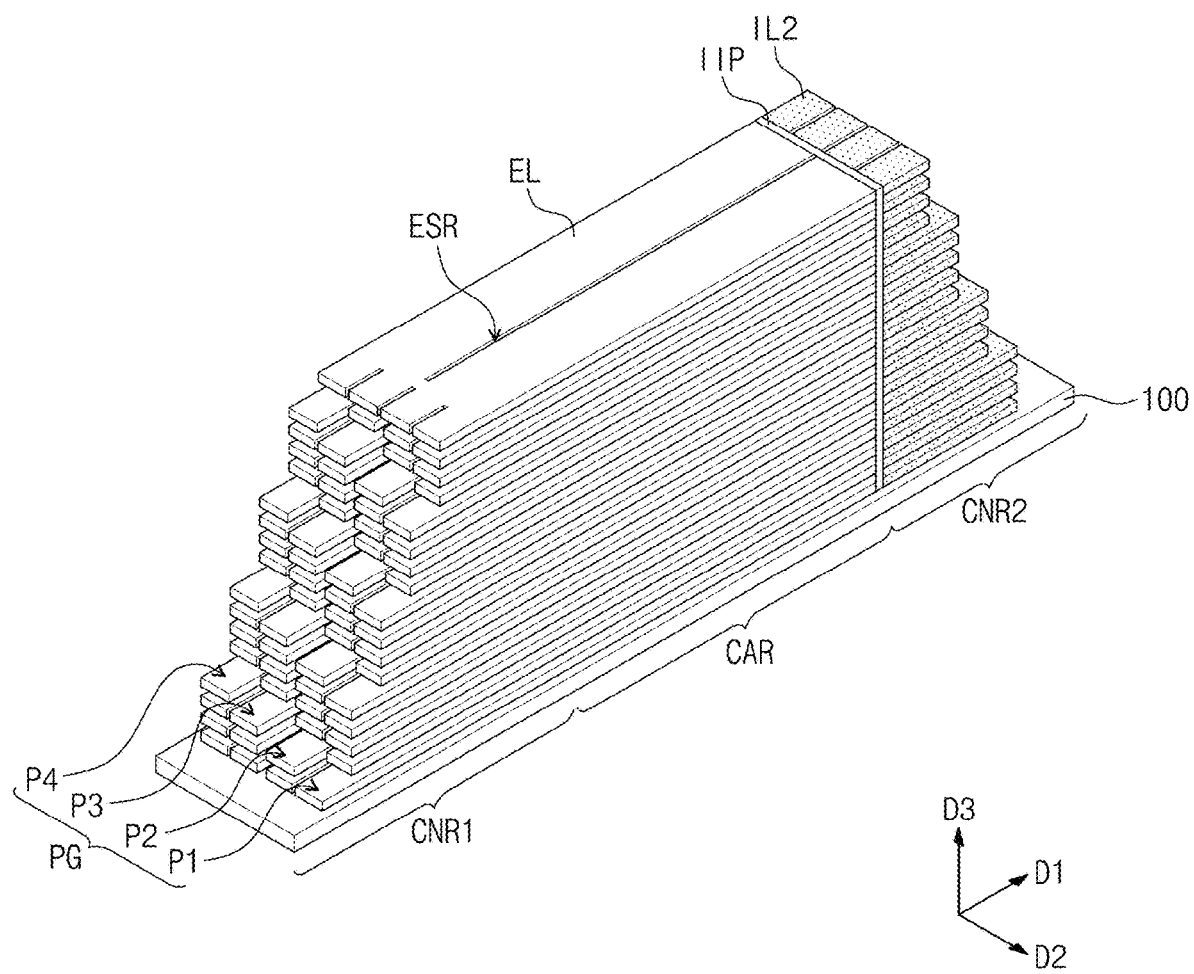
FIG. 6A is a perspective view illustrating some components of a stack structure.

FIG. 4 is a schematic plan view illustrating a 3D semiconductor memory device according to some example embodiments of the inventive concepts. FIGS. 5A, 5B and 5C are cross-sectional views taken along lines I-I', II-II' and III-III' of FIG. 4, respectively, to illustrate a 3D semiconductor memory device according to some example embodiments of the inventive concepts. FIG. 6A is a perspective view illustrating some components of a stack structure. FIG. 6B is a perspective view illustrating some components of a dummy stack structure.

Referring to FIGS. 4, 5A, 5B and 5C, the 3D semiconductor memory device according to some example embodiments may include a peripheral logic structure PS on a substrate 10 and a cell array structure CS on the peripheral logic structure PS.

The peripheral logic structure PS may include peripheral logic circuits PTR integrated on a front surface of the substrate 10. The substrate 10 may include a silicon substrate, a silicon-germanium substrate, a germanium substrate, or a single-crystalline epitaxial layer grown on a single-crystalline silicon substrate. The substrate 10 may include active regions defined by a device isolation layer 11.

The peripheral logic circuits PTR may include the row decoder 3, the column decoder 5, the page buffer 4 and the control logic circuit 6 described above and may include NMOS and PMOS transistors, low-voltage and high-voltage transistors and a resistor, which are integrated on the substrate 10. The peripheral logic circuits PTR may include a gate insulating layer 21 on the substrate 10, a peripheral gate electrode 23 on the gate insulating layer 21, and source/drain regions 25 disposed in the active region at both sides of the peripheral gate electrode 23.

Peripheral circuit interconnection lines 33 may be electrically connected to the peripheral logic circuits PTR through peripheral circuit contact plugs 31. For example, the peripheral circuit contact plugs 31 and the peripheral circuit interconnection lines 33 may be connected to the NMOS and PMOS transistors.

A lower filling insulation layer 50 may be provided on an entire top surface of the substrate 10. The lower filling insulation layer 50 may cover the peripheral logic circuits PTR, the peripheral circuit contact plugs 31, and the peripheral circuit interconnection lines 33 on the substrate 10. The lower filling insulation layer 50 may include a plurality of stacked insulating layers. For example, the lower filling insulation layer 50 may include at least one of a silicon oxide layer, a silicon nitride layer, or a silicon oxynitride layer.

The cell array structure CS may be disposed on the lower filling insulation layer 50. The cell array structure CS may include stack structures ST and a dummy stack structure DST, which are disposed on a horizontal semiconductor layer 100. The stack structures ST may include a first stack structure ST1 having a pad region on the first connection region CNR1, and a second stack structure ST2 having a pad region on the second connection region CNR2. The dummy stack structure DST may be disposed between the first stack structure ST1 and the second stack structure ST2. Referring to FIGS. 3, 4 and 5A to 5C, the first stack structure ST1 may be at least a portion of the first memory block BLK1. The second stack structure ST2 may be at least a portion of the second memory block BLK2. The dummy stack structure DST may be at least a portion of the dummy block DBLK. In other words, each of the memory blocks BLK1 and BLK2 may include at least one stack structure ST, and the dummy block DBLK may include at least one dummy stack structure DST.

The horizontal semiconductor layer 100 may be disposed on a top surface of the lower filling insulation layer 50. The horizontal semiconductor layer 100 may be formed of a semiconductor material. For example, the horizontal semiconductor layer 100 may include at least one of silicon (Si), germanium (Ge), silicon-germanium (SiGe), gallium-arsenic (GaAs), indium-gallium-arsenic (InGaAs), or aluminum-gallium-arsenic (AlGaAs). The horizontal semiconductor layer 100 may include a semiconductor material doped with dopants of a first conductivity type and/or an intrinsic semiconductor material not doped with dopants. The horizontal semiconductor layer 100 may have a crystal structure including at least one of a single-crystalline structure, an amorphous structure, or a poly-crystalline structure.

The horizontal semiconductor layer 100 may include a first opening OP1 and a second opening OP2 which expose portions of the top surface of the lower filling insulation layer 50. An inner insulating layer ILD may be formed in the first and second openings OP1 and OP2. The inner insulating layer ILD may be formed of an insulating material to inhibit (or, alternatively, prevent) the first through-interconnections PLGa and the second through-interconnections PLGb, which penetrate the horizontal semiconductor layer 100, from electrically interfering with each other. The inner insulating layer ILD may include, for example, a silicon oxide layer. A top surface of the inner insulating layer ILD may be substantially coplanar with a top surface of the horizontal semiconductor layer 100. The inner insulating layer ILD and the horizontal semiconductor layer 100 may support the first stack structure ST1, the second stack structure ST2, and the dummy stack structure DST.

In more detail, referring to FIGS. 4, 5A and 6A, the first stack structure ST1 may be disposed on the horizontal semiconductor layer 100. The first stack structure ST1 may include first insulating layers IL1, second insulating layers IL2, and electrode layers ELa to ELd. The first insulating layers IL1 may be stacked in a third direction D3 on the horizontal semiconductor layer 100. The first insulating layers IL1 may be formed on the first connection region CNR1, the second connection region CNR2, and the cell array region CAR.

The electrode layers ELa to ELd and the first insulating layers IL1 may be alternately stacked on the first connection region CNR1 and the cell array region CAR. In other words, the electrode layers ELa to ELd may not be disposed on the second connection region CNR2. Lengths in the first direction D1 and widths in the second direction D2 of the electrode layers ELa to ELd may decrease regularly as a vertical distance from the horizontal semiconductor layer 100 increases. In other words, areas of the electrode layers ELa to ELd may decrease sequentially as the vertical distance from the horizontal semiconductor layer 100 increases.

The second insulating layers IL2 and the first insulating layers IL1 may be alternately stacked on the second connection region CNR2. The second insulating layers IL2 may include a different insulating material from that of the first insulating layers IL1. The second insulating layers IL2 may include a material having an etch selectivity with respect to the first insulating layers IL1. For example, the first insulating layers IL1 may include silicon oxide, and the second insulating layers IL2 may include silicon nitride. The second insulating layers IL2 may be disposed on sidewalls of the electrode layers ELa to ELd. Each of the second insulating layers IL2 may be located at the same level as each of the electrode layers ELa to ELd, which is disposed on a sidewall thereof. The second insulating layers IL2 may overlap with at least a portion of the second opening OP2 of the horizontal semiconductor layer 100.

A separation insulating pattern IIP may be disposed between the second insulating layers IL2 and the electrode layers ELa to ELd. The separation insulating pattern IIP may intersect or section the first stack structure ST1 in the second direction D2 and the third direction D3 to separate the second insulating layers IL2 from the electrode layers ELa to ELd. The separation insulating pattern IIP may be disposed between the cell array region CAR and the second connection region CNR2 when viewed in a plan view. The first insulating layers IL1 may be divided by the separation insulating pattern IIP. In other words, the first insulating layers IL1 on the cell array region CAR may be spaced apart from the first insulating layers IL1 on the second connection region CNR2 with the separation insulating pattern IIP interposed therebetween. The separation insulating pattern IIP may inhibit (or, alternatively, prevent) the second insulating layers IL2 from being replaced with the electrode layers ELa to ELd in a method of manufacturing a 3D semiconductor memory device, which will be described later. In other words, the second insulating layer IL2 may be a portion of a sacrificial layer, which is not replaced with an electrode but remains in an electrode replacement process to be described later.

The first stack structure ST1 may include pads P1 to P4 which are connected to contact plugs CPLG on the first connection region CNR1, as illustrated in FIGS. 4 and 6A. The pads P1 to P4 arranged in the second direction D2 may constitute one pad group PG. For example, the pad group PG may include a first pad P1, a second pad P2, a third pad P3 and a fourth pad P4 which are located at vertical levels increasing sequentially in the second direction D2. The pads P1 to P4 may be located at positions horizontally and vertically different from each other. The pads P1 to P4 may be portions of the electrode layers ELa to ELd. For example, the first pad P1 of a first electrode layer ELa may be a portion of the first electrode layer ELa, which is exposed by a second electrode layer ELb.

The first stack structure ST1 may include a plurality of the pad groups PG arranged in the first direction D1. The pad groups PG may be located at levels which increase sequentially as a distance from the cell array region CAR decreases.

Vertical channel structures VS may be provided on the horizontal semiconductor layer 100 of the cell array region CAR. The vertical channel structures VS may extend in the third direction D3 and may penetrate the first stack structure ST1. In other words, the vertical channel structures VS may penetrate the electrode layers ELa to ELd and the first insulating layers IL1 so as to be connected to the horizontal semiconductor layer 100. The vertical channel structures VS may be arranged in a line or in a zigzag form in one direction when viewed in a plan view.

The vertical channel structures VS may include a semiconductor material such as silicon (Si), germanium (Ge), or a combination thereof. In addition, the vertical channel structures VS may include a semiconductor material doped with dopants or an intrinsic semiconductor material not doped with dopants. Each of the vertical channel structures VS may include a semiconductor pattern, a filling insulation pattern in an inner space of the semiconductor pattern, and a vertical insulating pattern surrounding the semiconductor pattern. The vertical insulating pattern may have a pipe or macaroni shape of which top and bottom ends are opened.

The semiconductor pattern may extend in the third direction D3 and may be connected to the horizontal semiconductor layer 100. The vertical insulating pattern may extend in the third direction D3 and may surround a sidewall of the semiconductor pattern. The vertical insulating pattern may be at least a portion of a data storage layer. For example, the vertical insulating pattern may be at least a portion of a data storage layer of a NAND flash memory device and may include a tunnel insulating layer, a charge storage layer, and a blocking insulating layer. Even though not shown in the drawings, each of the vertical channel structures VS may further include a lower semiconductor pattern between the semiconductor pattern and the horizontal semiconductor layer 100.

The first stack structure ST1 may include electrode separation regions ESR extending in the first direction D1. Common source regions CSR may be provided in the horizontal semiconductor layer 100 under the electrode separation regions ESR. The common source regions CSR may extend in parallel to the electrode separation regions ESR in the first direction D1. The common source regions CSR may include dopants of which a conductivity type is opposite to that of the horizontal semiconductor layer 100. For example, the common source regions CSR may include N-type dopants (e.g., arsenic (As) or phosphorus (P)). The electrode separation regions ESR may be filled with an insulating material, and common source plugs CSP may penetrate the insulating material in the electrode separation regions ESR so as to be connected to the common source regions CSR. The common source plug CSP may penetrate the first stack structure ST1 so as to be connected to the common source region CSR in the horizontal semiconductor layer 100.

A first interlayer insulating layer 151 may cover top surfaces of the vertical channel structures VS, and an upper filling insulation layer 150 provided on the first and second connection regions CNR1 and CNR2. A second interlayer insulating layer 152 may be disposed on the first interlayer insulating layer 151 to cover the common source plug CSP.

Contact plugs CPLG may be provided on the first connection region CNR1. The contact plugs CPLG may penetrate the second interlayer insulating layer 152, the first interlayer insulating layer 151, and the upper filling insulation layer 150 so as to be connected to the pads P1 to P4 of the first stack structure ST1. The contact plugs CPLG may electrically connect the electrode layers ELa to ELd to conductive lines CL disposed on the second interlayer insulating layer 152. The number of the contact plugs CPLG may be equal to the number of the electrode layers ELa to ELd constituting the first stack structure ST1. The contact plugs CPLG may extend from the pads P1 to P4 in the third direction D3 which is vertical to the top surface of the horizontal semiconductor layer 100. Thus, like the pads P1 to P4, the contact plugs CPLG may be arranged to be spaced apart from each other in the first direction D1 and the second direction D2. Since the pads P1 to P4 constitute the stair structure, bottom surfaces of the contact plugs CPLG may be located at different levels from each other.

The first through-interconnections PLGa may be provided on the second connection region CNR2. The first through-interconnections PLGa may penetrate the second interlayer insulating layer 152, the first interlayer insulating layer 151, the upper filling insulation layer 150, the first stack structure ST1, and the horizontal semiconductor layer 100 and may extend into the peripheral logic structure PS. In other words, the first through-interconnections PLGa may penetrate the first insulating layers IL1 and the second insulating layers IL2 of the first stack structure ST1 so as to be connected to the peripheral circuit interconnection lines 33. The first through-interconnections PLGa may electrically connect the peripheral logic circuits PTR to conductive lines CL disposed on the second interlayer insulating layer 152. The first through-interconnections PLGa may be used to electrically connect the row decoder of the peripheral logic structure ST to electrode layers (not shown) of another stack structure (not shown) adjacent to the first stack structure ST1.

Bit line contact plugs BPLG may be provided on the vertical channel structures VS of the cell array region CAR. The bit line contact plugs BPLG may penetrate the first and second interlayer insulating layers 151 and 152 so as to be connected to the vertical channel structures VS, respectively. The bit line contact plugs BPLG may connect the vertical channel structures VS to bit lines BL disposed on the second interlayer insulating layer 152. The bit lines BL may intersect the first and second stack structures ST1 and ST2 and may extend in the second direction D2.

Referring to FIGS. 4 and 5B, the second stack structure ST2 may be spaced apart from the first stack structure ST1 with the dummy stack structure DST interposed therebetween. Positions of the pad region and the first through-interconnection region of the second stack structure ST2 may be different from those of the pad region and the first through-interconnection region of the first stack structure ST1, and other features of the second stack structure ST2 may be the same or similar as corresponding features of the first stack structure ST1. Unlike the first stack structure ST1, the second stack structure ST2 may have the pad region on the second connection region CNR2 and may have the first through-interconnection region on the first connection region CNR1. The second stack structure ST2 and the first stack structure ST1 may be symmetrical in the first direction D1 and the second direction D2. Detailed descriptions to the same/similar components as mentioned above are omitted for the purpose of ease and convenience in explanation.

Referring to FIGS. 4, 5C and 6B, the dummy stack structure DST may be disposed between the first stack structure ST1 and the second stack structure ST2. The dummy stack structure DST may extend in the first direction D1 in parallel to the first stack structure ST1 and the second stack structure ST2. The dummy stack structure DST may include first insulating layers IL1, second insulating layers IL2, and dummy electrode layers DELa to DELd. Unlike the first and second stack structures ST1 and ST2, the dummy stack structure DST may have pad regions disposed on the first and second connection regions CNR1 and CNR2, respectively.

Dummy pads DP1 to DP4 may be portions of the dummy electrode layers DELa to DELd. For example, a first dummy pad DP1 may be a portion of a first dummy electrode layer DELa, which is exposed by a second dummy electrode layer DELb. The number of the dummy pads of the dummy stack structure DST may be more than the number of the pads of each of the first stack structure ST1 and the second stack structure ST2. For example, the dummy stack structure DST may include a pair of dummy pad groups DPG facing each other in the second direction D2. In addition, a width of the dummy stack structure DST in the second direction D2 may be greater than widths of the first and second stack structures ST1 and ST2 in the second direction D2.

As illustrated in FIG. 5C, the first insulating layers IL1 of the dummy stack structure DST may be stacked in the third direction D3 on the horizontal semiconductor layer 100. The first insulating layers IL1 may be formed on the first connection region CNR1, the cell array region CAR, and the second connection region CNR2. The second insulating layers IL2 of the dummy stack structure DST may be stacked alternately with the first insulating layers IL1 on the cell array region CAR.

The dummy electrode layers DELa to DELd may be stacked alternately with the first insulating layers IL1 and may be disposed on sidewalls of the second insulating layers IL2. Each of the dummy electrode layers DELa to DELd may have an opening OP penetrating it in the third direction D3, as illustrated in FIG. 6B. The second insulating layers IL2 may be disposed in the openings OP of the dummy electrode layers DELa to DELd, respectively. In other words, each of the dummy electrode layers DELa to DELd may surround sidewalls of the second insulating layer IL2 located at the same level as each of the dummy electrode layers DELa to DELd. One sidewall IL2s of the second insulating layer IL2 may include a portion having a curved surface shape. In more detail, sidewalls of the second insulating layer IL2, which are opposite to each other in the second direction D2, may have flat shapes. Sidewalls IL2s of the second insulating layer IL2, which are opposite to each other in the first direction D1 and are adjacent to the pad regions, may include the portions having the curved surface shapes.

Lengths in the first direction D1 and widths in the second direction D2 of the dummy electrode layers DELa to DELd may decrease regularly as a vertical distance from the horizontal semiconductor layer 100 increases. In other words, areas of the dummy electrode layers DELa to DELd may decrease sequentially as the vertical distance from the horizontal semiconductor layer 100 increases. The second insulating layers IL2 may have lengths in the first direction D1 and widths in the second direction D2, which are substantially constant regardless of the vertical distance from the horizontal semiconductor layer 100. Thus, a ratio of an area of the second insulating layer IL2 to an area of the dummy electrode layer DELa, DELb, DELc or DELd may increase as a vertical distance from the horizontal semiconductor layer 100 increases.

The dummy electrode layers DELa to DELd having the same length in the first direction D1 may constitute a dummy electrode layer group DELG. For example, the dummy electrode layer group DELG may include a first dummy electrode layer DELa, a second dummy electrode layer DELb, a third dummy electrode layer DELc, and a fourth dummy electrode layer DELd. A length in the first direction D1 of the dummy electrode layer group DELG relatively far from the horizontal semiconductor layer 100 may be less than a length in the first direction D1 of the dummy electrode layer group DELG relatively close to the horizontal semiconductor layer 100.

Second through-interconnections PLGb may penetrate the dummy stack structure DST on the cell array region CAR and may extend into the peripheral logic structure PS. The second through-interconnections PLGb may connect conductive lines PLb to the peripheral circuit interconnection lines 33 in the peripheral logic structure PS. For example, the conductive lines PLb may be electrically connected to the bit lines BL disposed on the first and second stack structures ST1 and ST2. For another example, the conductive lines PLb may be portions of the bit lines BL. The second through-interconnections PLGb may electrically connect the vertical channel structures VS in the first and second stack structures ST1 and ST2 to the peripheral logic structure PS.

A first conductive line CLa and a second conductive line CLb may be disposed on the second interlayer insulating layer 152. The dummy electrode layers DELa to DELd of the dummy stack structure DST disposed on the first and second connection regions CNR1 and CNR2 may be connected to the first and second conductive lines CLa and CLb to function as a capacitor.

In detail, the first conductive line CLa may be disposed on the second interlayer insulating layer 152 of the first connection region CNR1. The first conductive line CLa may be electrically connected to a plurality of the dummy electrode layers DELa to DELd through first conductive plugs CPLa. In other words, the first conductive plugs CPLa may be disposed between the first conductive line CLa and the dummy electrode layers DELa to DELd. The first conductive plugs CPLa may be connected in common to the first conductive line CLa. Further, the first conductive plugs CPLa may be electrically connected to each of the dummy electrode layers DELa to DELd. For example, the first conductive line CLa may be electrically connected to the fourth dummy electrode layers DELd of the dummy electrode layer groups DELG. The first conductive line CLa may be electrically connected to the peripheral logic structure PS through a third through-interconnection TCPa penetrating the upper filling insulation layer 150.

The second conductive line CLb may be disposed on the second interlayer insulating layer 152 of the second connection region CNR2. The second conductive line CLb may be electrically connected to a plurality of the dummy electrode layers DELa to DELd through second conductive plugs CPLb. In other words, the second conductive plugs CPLb may be disposed between the second conductive line CLb and the dummy electrode layers DELa to DELd. The second conductive plugs CPLb may be connected in common to the second conductive line CLb. Further, the second conductive plugs CPLb may be electrically connected to each of the dummy electrode layers DELa to DELd. Here, the second conductive line CLb may be electrically connected to different dummy electrode layers DELa to DELd from the dummy electrode layers DELa to DELd connected to the first conductive line CLa. For example, the second conductive line CLb may be electrically connected to the third dummy electrode layers DELc of the dummy electrode layer groups DELG. The second conductive line CLb may be electrically connected to the peripheral logic structure PS through a fourth through-interconnection TCPb penetrating the upper filling insulation layer 150. The third dummy electrode layers DELc and the fourth dummy electrode layers DELd connected to the first conductive line CLa may constitute the capacitor. In other words, the capacitor including the third dummy electrode layers DELc and the fourth dummy electrode layers DELd may receive or output charges through the first conductive line CLa and the second conductive line CLb. Methods of forming the capacitor by electrical connection between the first conductive line CLa, the second conductive line CLb and the dummy electrode layers DELa to DELd will be described hereinafter in more detail with reference to FIGS. 7A and 7B.

Figure 7A:
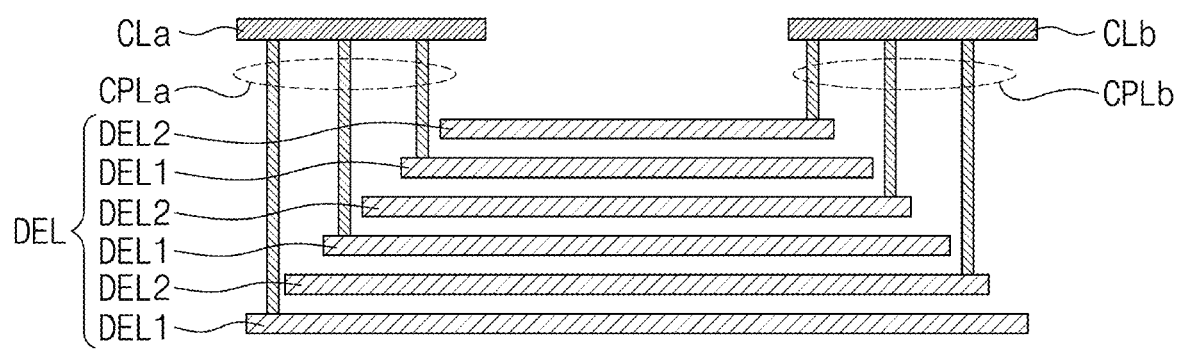
FIGS. 7A and 7B are conceptual views illustrating capacitors according to some example embodiments of the inventive concepts.
Figure 7B:
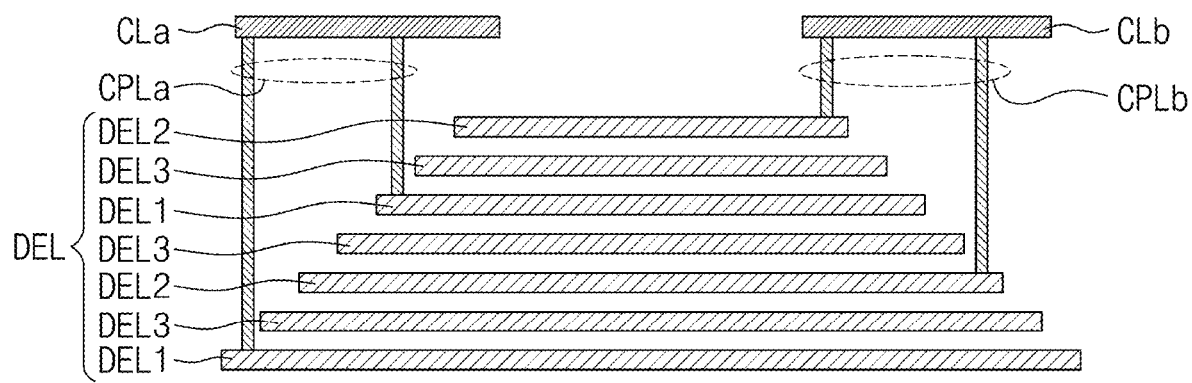

FIGS. 7A and 7B are conceptual views illustrating capacitors according to some embodiments of the inventive concepts.

Referring to FIG. 7A, as described above, a 3D semiconductor memory device according to some example embodiments of the inventive concepts may include dummy electrode layers DEL, a first conductive line CLa, and a second conductive line CLb. The dummy electrode layers DEL may be stacked in the third direction D3.

The first conductive line CLa may be electrically connected to the dummy electrode layers DEL through first conductive plugs CPLa. The first conductive line CLa may be electrically connected to a plurality of first conductive layers DEL1 of the dummy electrode layers DEL. The second conductive line CLb may be electrically connected to the dummy electrode layers DEL through second conductive plugs CPLb. The second conductive line CLb may be electrically connected to a plurality of second conductive layers DEL2 of the dummy electrode layers DEL. Here, the first conductive layers DEL1 and the second conductive layers DEL2 may be alternately stacked in the third direction D3. In other words, one of the second conductive layers DEL2 may be disposed between adjacent two of the first conductive layers DEL1, and one of the first conductive layers DEL1 may be disposed between adjacent two of the second conductive layers DEL2. The first conductive layers DEL1 and the second conductive layers DEL2 may face each other to function as electrodes of a capacitor. A capacitance may be formed between the first conductive layers DEL1 and the second conductive layers DEL2.

Referring to FIG. 7B, the first conductive layers DEL1 connected to the first conductive line CLa and the second conductive layers DEL2 connected to the second conductive line CLb may be alternately stacked in the third direction D3. A third conductive layer DEL3 may be disposed between the first conductive layer DEL1 and the second conductive layer DEL2. The third conductive layer DEL3 may be electrically insulated from the first conductive line CLa and the second conductive line CLb. The third conductive layer DEL3 may be electrically floated.

FIGS. 8A, 9A, 10A, 11A and 12A are cross-sectional views corresponding to the line I-I' of FIG. 4 to illustrate a method of manufacturing a 3D semiconductor memory device according to some example embodiments of the inventive concepts. FIGS. 8B, 9B, 10B, 11B and 12B are cross-sectional views corresponding to the line III-III' of FIG. 4 to illustrate a method of manufacturing a 3D semiconductor memory device according to some example embodiments of the inventive concepts.

Referring to FIGS. 4, 8A and 8B, a peripheral logic structure PS may be formed on a substrate 10. The substrate 10 may be, for example, a silicon substrate having a first conductivity type (e.g., a P-type). A device isolation layer 11 may be formed in the substrate 10 to define active regions.

The formation of the peripheral logic structure PS may include forming peripheral logic circuits PTR on the substrate 10, forming peripheral interconnection structures 31 and 33 connected to the peripheral logic circuits PTR, and forming a lower filling insulation layer 50. Here, the peripheral logic circuits PTR may include MOS transistors using the substrate 10 as channels. In some example embodiments, the formation of the peripheral logic circuits PTR may include forming a gate insulating layer 21 and a peripheral gate electrode 23 which are sequentially stacked on the substrate 10, and forming source/drain regions 25 by injecting dopants into the substrate 10 at both sides of the peripheral gate electrode 23. Peripheral circuit gate spacers may be formed on both sidewalls of the peripheral gate electrode 23.

The lower filling insulation layer 50 may include one insulating layer or a plurality of stacked insulating layers, which covers the peripheral logic circuits PTR. For example, the lower filling insulation layer 50 may include at least one of a silicon oxide layer, a silicon nitride layer, a silicon oxynitride layer, or a low-k dielectric layer.

The formation of the peripheral interconnection structures 31 and 33 may include forming peripheral circuit contact plugs 31 penetrating portions of the lower filling insulation layer 50, and forming peripheral circuit interconnection lines 33 connected to the peripheral circuit contact plugs 31.

A horizontal semiconductor layer 100 may be formed by depositing a semiconductor material on the lower filling insulation layer 50. The horizontal semiconductor layer 100 may have a single-crystalline or poly-crystalline structure. In some example embodiments, the horizontal semiconductor layer 100 may be formed by depositing a poly-silicon layer. The poly-silicon layer may be doped with dopants of the first conductivity type during the deposition process thereof. The horizontal semiconductor layer 100 may include a cell array region CAR and first and second connection regions CNR1 and CNR2. The horizontal semiconductor layer 100 may be patterned to form first and second openings OP1 and OP2, and an inner insulating layer ILD may be formed to fill the first and second openings OP1 and OP2.

Figure 9A:
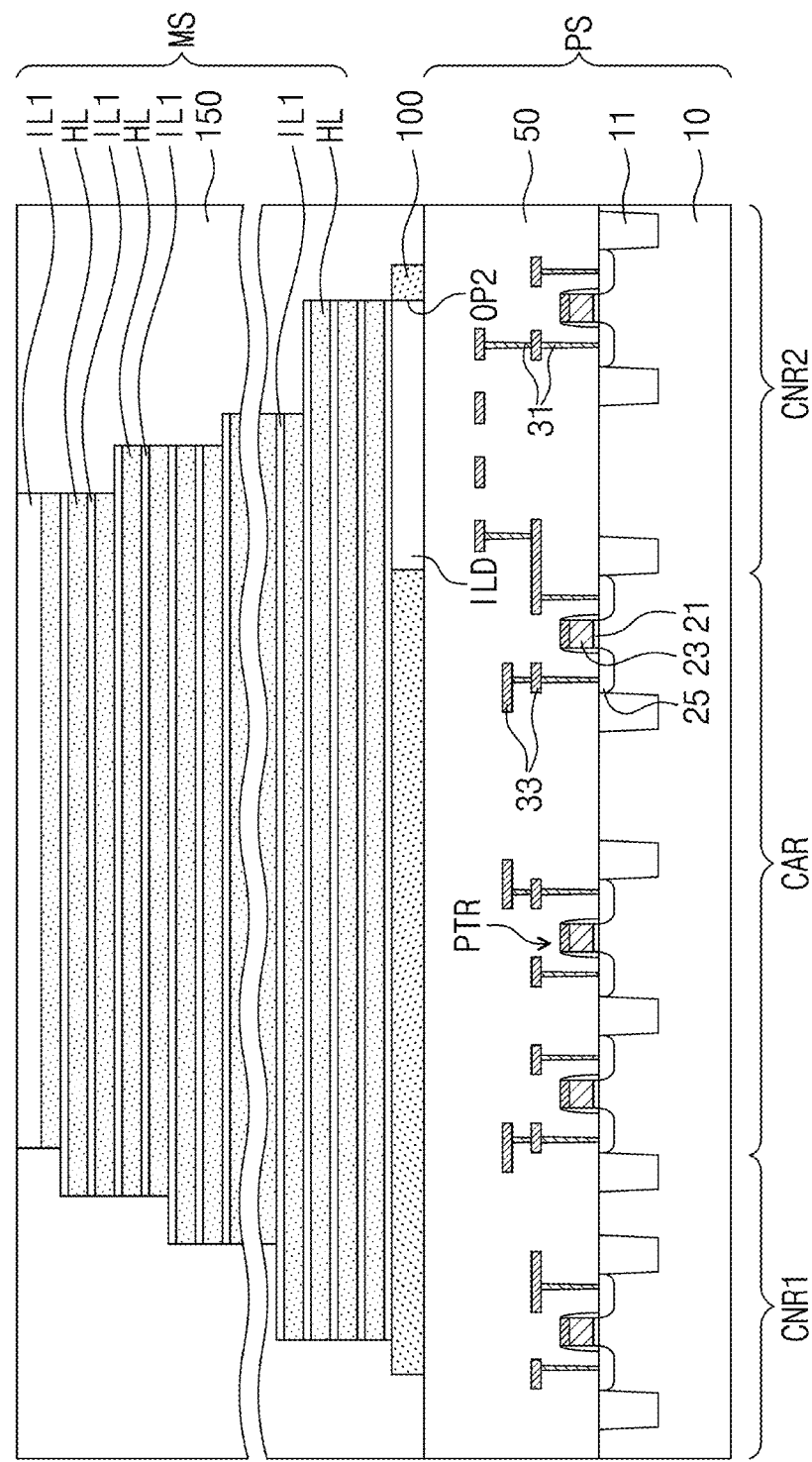
Figure 9B:
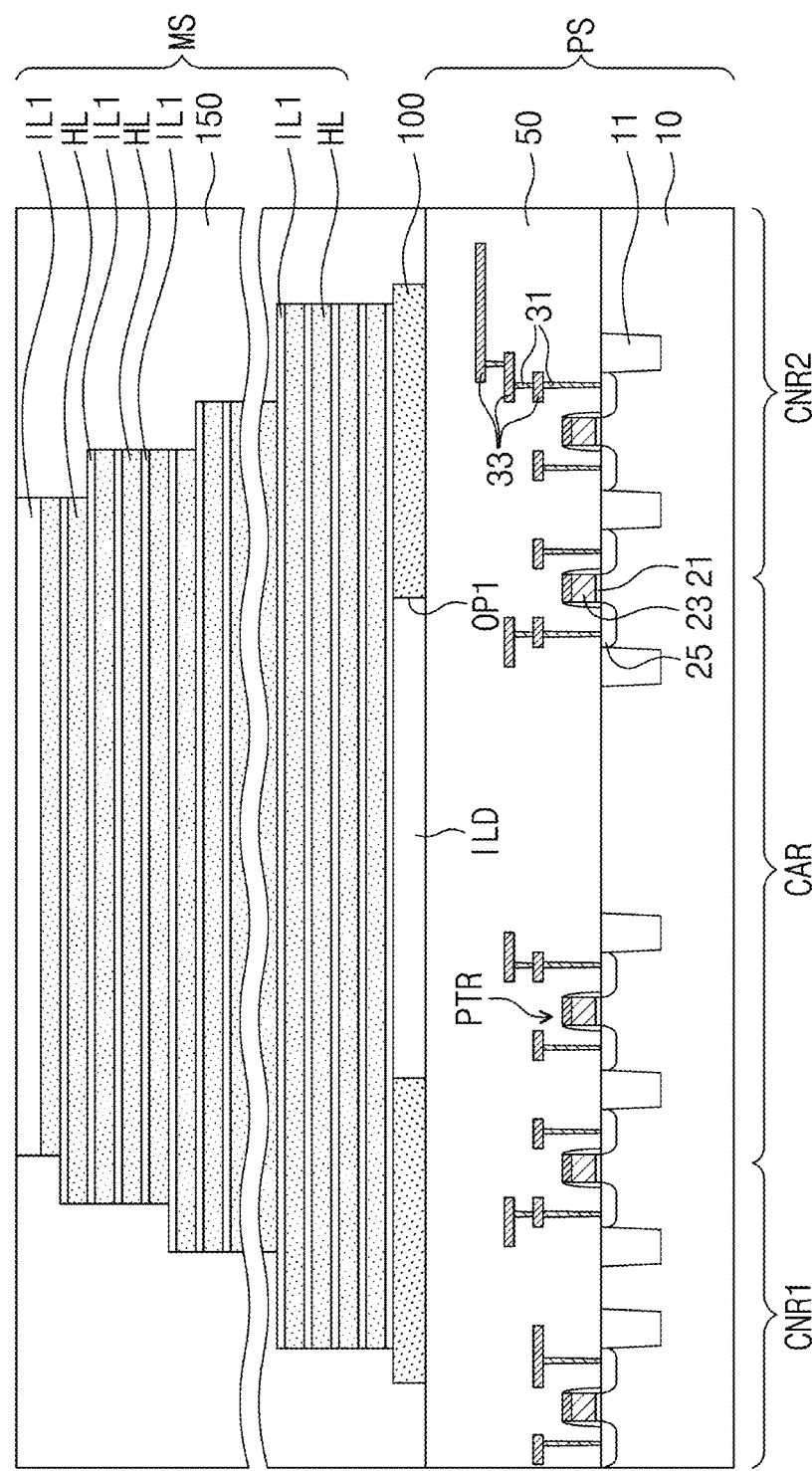

Referring to FIGS. 4, 9A and 9B, a mold structure MS may be formed on the horizontal semiconductor layer 100. The mold structure MS may include first insulating layers IL1 and sacrificial layers HL, which are vertically and alternately stacked. Here, the sacrificial layers HL may be formed of a material having an etch selectivity with respect to the first insulating layers IL1. For example, each of the sacrificial layers HL may be formed of a silicon nitride layer, and each of the first insulating layers IL1 may be formed of a silicon oxide layer.

In more detail, the formation of the mold structure MS may include forming a thin-layer structure (not shown) including the sacrificial layers HL and the first insulating layers IL1 alternately stacked on an entire top surface of the horizontal semiconductor layer 100, and performing a trimming process on the thin-layer structure. The trimming process may include a process of forming a mask pattern (not shown) covering the thin-layer structure on the cell array region CAR and the first and second connection regions CNR1 and CNR2, a process of etching a portion of the thin-layer structure, a process of reducing a planar area of the mask pattern, and a process of alternately repeating the process of etching a portion of the thin-layer structure and the process of reducing a planar area of the mask pattern. Since the trimming process is performed, the mold structure MS may have stair structures on the first and second connection regions CNR1 and CNR2 of the horizontal semiconductor layer 100.

An upper filling insulation layer 150 may be formed on an entire top surface of the horizontal semiconductor layer 100 after the formation of the mold structure MS. The upper filling insulation layer 150 may have a substantially flat top surface. A filling insulation layer thicker than the mold structure MS may be formed, and then, a planarization process may be performed on the filling insulation layer to form the upper filling insulation layer 150.

Figure 10A:
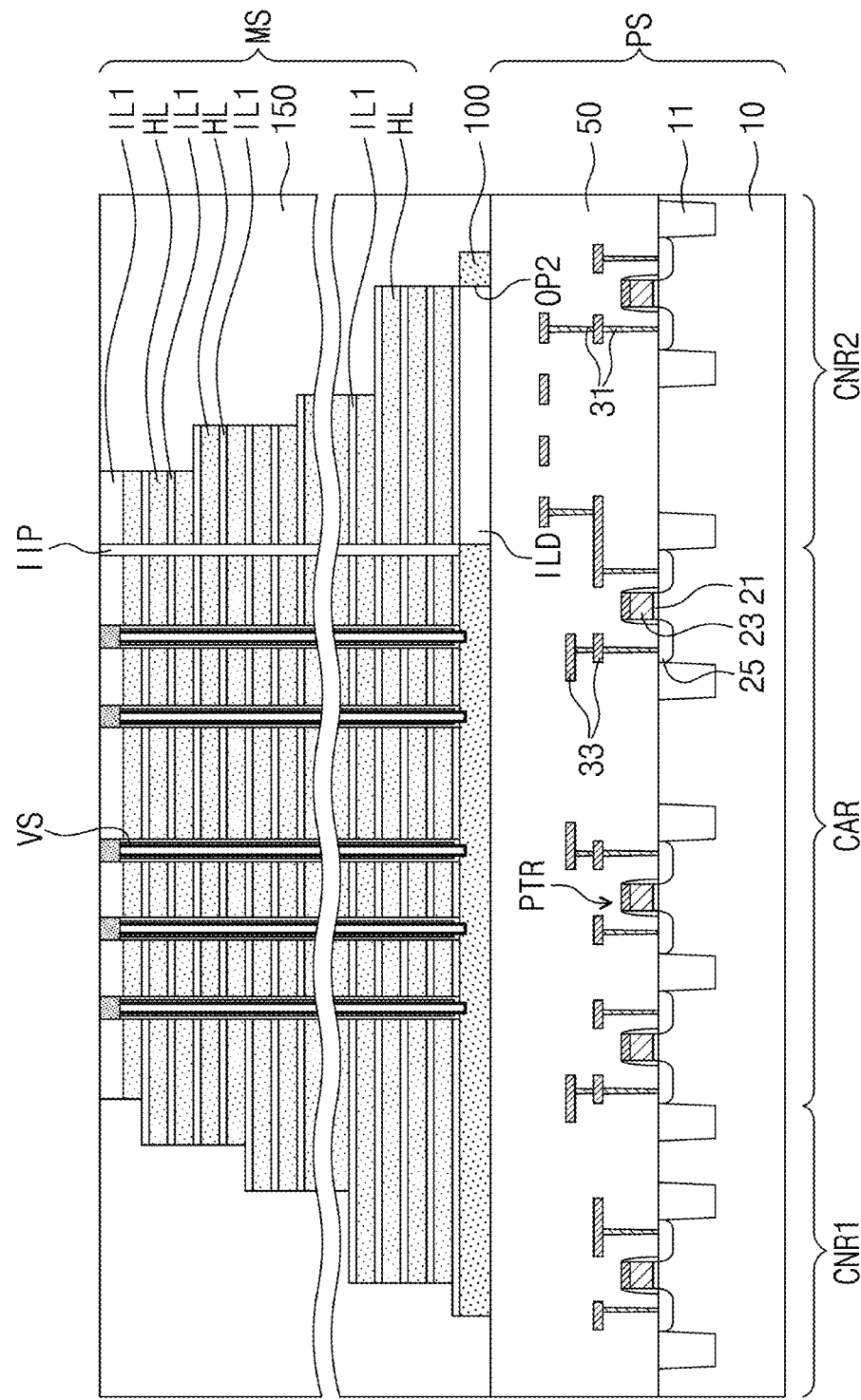
Figure 10B:
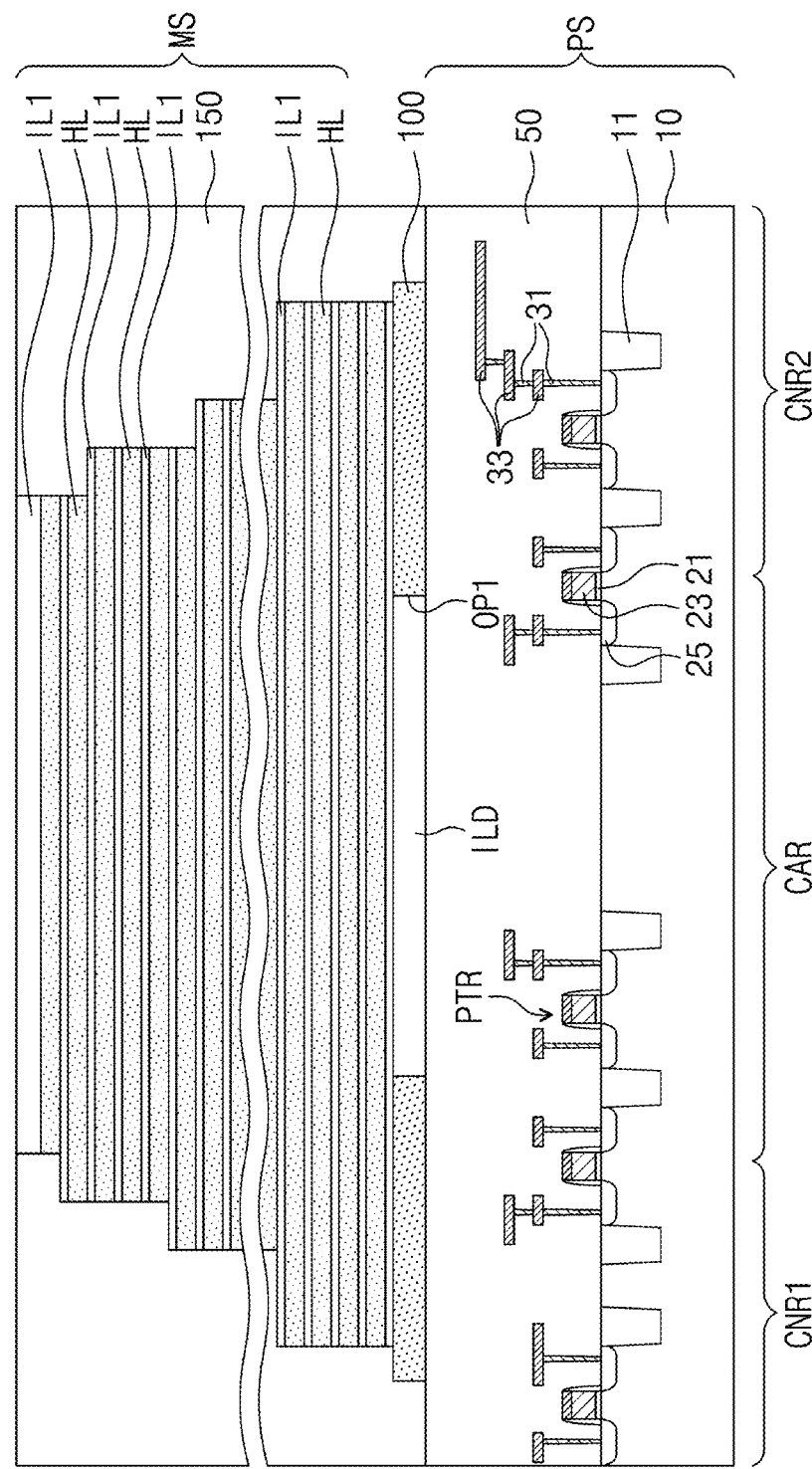

Referring to FIGS. 4, 10A and 10B, vertical channel structures VS may be formed to penetrate the mold structure MS. The formation of the vertical channel structures VS may include forming vertical holes which penetrate the mold structure MS to expose the horizontal semiconductor layer 100, and forming a semiconductor pattern in each of the vertical holes. A vertical insulating pattern may be formed in each of the vertical holes before the formation of the semiconductor pattern. The formation of the vertical insulating pattern may include depositing a vertical insulating layer and a first semiconductor layer having uniform thicknesses on inner surfaces of the vertical holes, and anisotropically etching the first semiconductor layer and the vertical insulating layer to expose portions of the horizontal semiconductor layer 100. Thereafter, a second semiconductor layer may be formed in each of the vertical holes. The first and second semiconductor layers may constitute the semiconductor pattern. A separation insulating pattern IIP may be formed together during the formation of the vertical channel structures VS. The separation insulating pattern IIP may be formed between the second connection region CNR2 and the cell array region CAR or between the first connection region CNR1 and the cell array region CAR when viewed in a plan view.

Figure 11A:
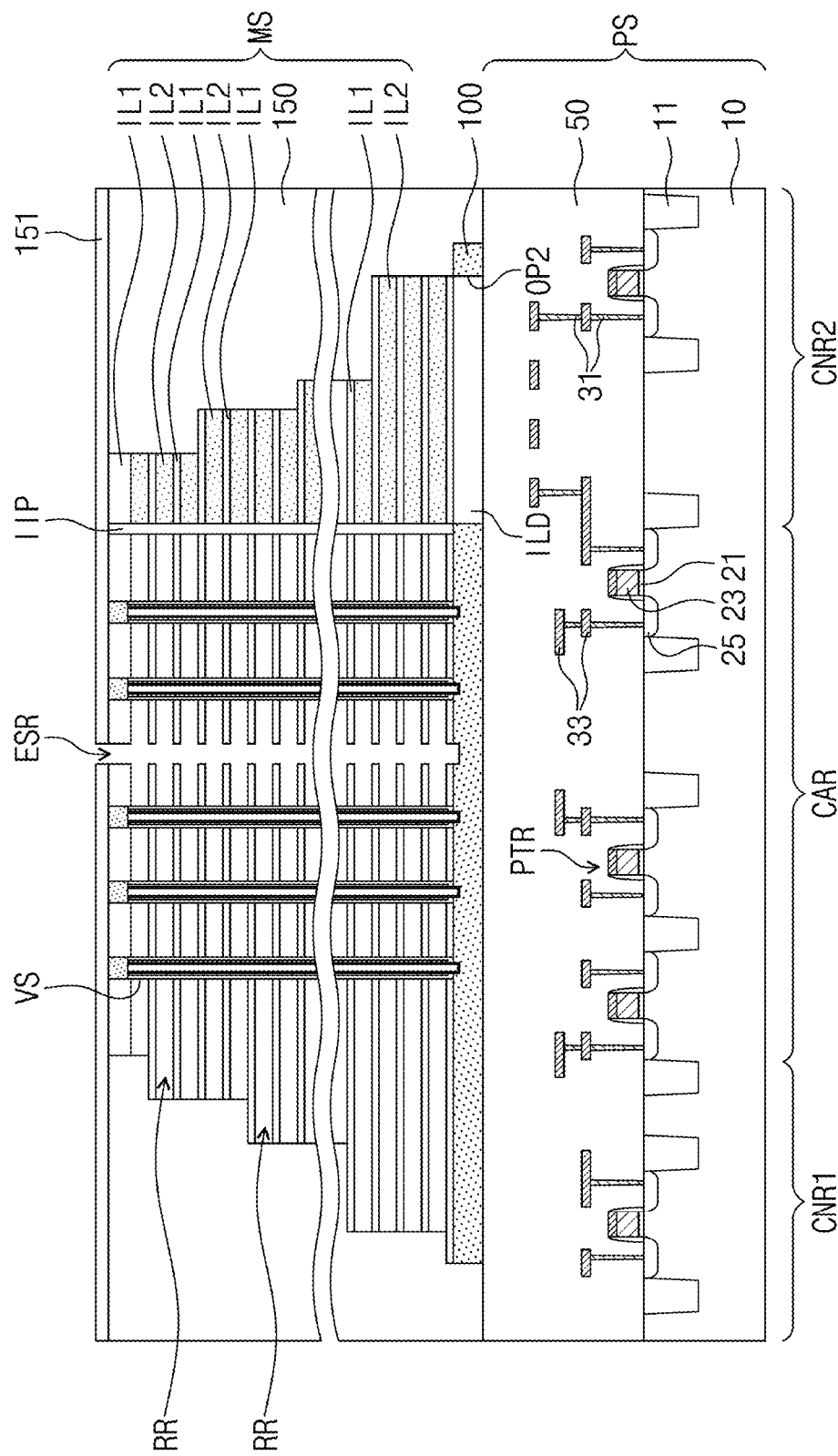
Figure 11B:
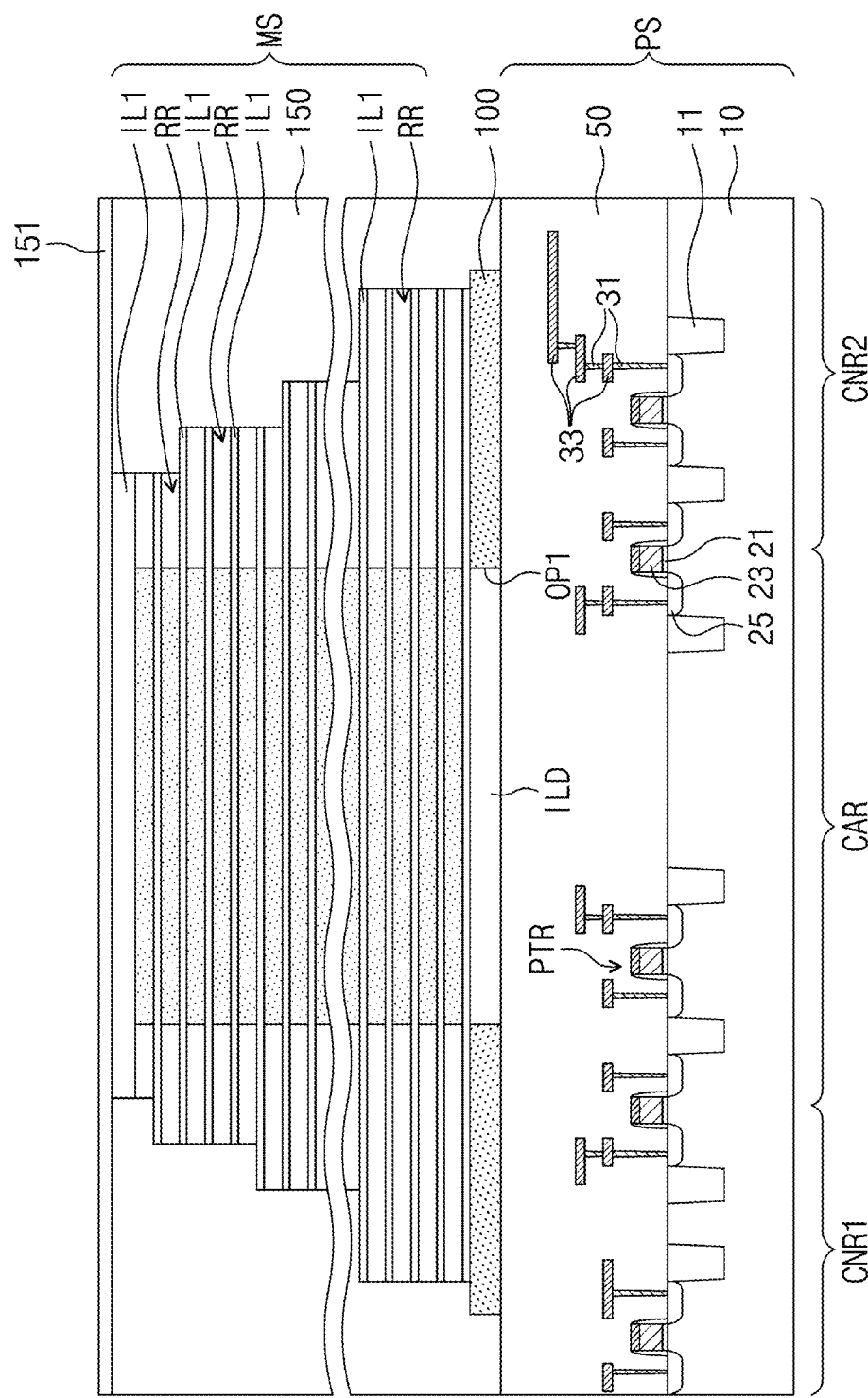

Referring to FIGS. 4, 11A and 11B, a first interlayer insulating layer 151 may be formed on top surfaces of the vertical channel structures VS and the upper filling insulation layer 150. After the formation of the first interlayer insulating layer 151, electrode separation regions ESR may be formed to penetrate the first interlayer insulating layer 151 and the mold structure MS. The electrode separation regions ESR may expose the horizontal semiconductor layer 100. The electrode separation regions ESR may be formed using an anisotropic etching process and may expose sidewalls of the mold structure MS.

The electrode separation regions ESR may extend from the cell array region CAR onto the first and second connection regions CNR1 and CNR2 in the first direction D1. Lengths, in the first direction D1, of some of the electrode separation regions ESR may be shorter than lengths, in the first direction D1, of others of the electrode separation regions ESR. A plurality of sub-mold structures spaced apart from each other in the second direction D2 may be formed by the formation of the electrode separation regions ESR.

Next, the sacrificial layers HL exposed by the electrode separation regions ESR may be removed to form recess regions RR. Each of the recess regions RR may be an empty space provided between the first insulating layers IL1 vertically adjacent to each other and may expose portions of sidewalls of the vertical channel structures VS. In addition, the recess regions RR may expose a sidewall of the separation insulating pattern IIP. The recess regions RR may be formed by isotropically etching the sacrificial layers HL using an etch recipe having an etch selectivity with respect to the first insulating layers IL1, the vertical channel structures VS, and the horizontal semiconductor layer 100. For example, when the sacrificial layers HL are silicon nitride layers and the first insulating layers IL1 are silicon oxide layers, the isotropic etching process may be performed using an etching solution including phosphoric acid.

Second insulating layers IL2 may be formed by leaving portions of the sacrificial layers HL. The second insulating layers IL2 may be formed in a central portion of a dummy stack structure DST on the cell array region CAR. In detail, the etching solution may be provided from sidewalls of the sacrificial layers HL exposed by the electrode separation regions ESR into stack structures ST and the dummy stack structure DST. Thus, the central portion of the dummy stack structure DST on the cell array region CAR, in which the electrode separation region ESR is not formed, may not be etched unlike other portions of the dummy stack structure DST close to the electrode separation regions ESR. Thus, the second insulating layers IL2 may be formed in the central portion of the dummy stack structure DST on the cell array region CAR by adjusting a process time of the isotropic etching process. In addition, the second insulating layers IL2 may also be formed in portions of first and second stack structures ST1 and ST2, sidewalls of which are not exposed due to the separation insulating pattern IIP. On the contrary, the sacrificial layers HL in a region where the electrode separation regions ESR are densely formed may be completely removed by the isotropic etching process.

Figure 12A:
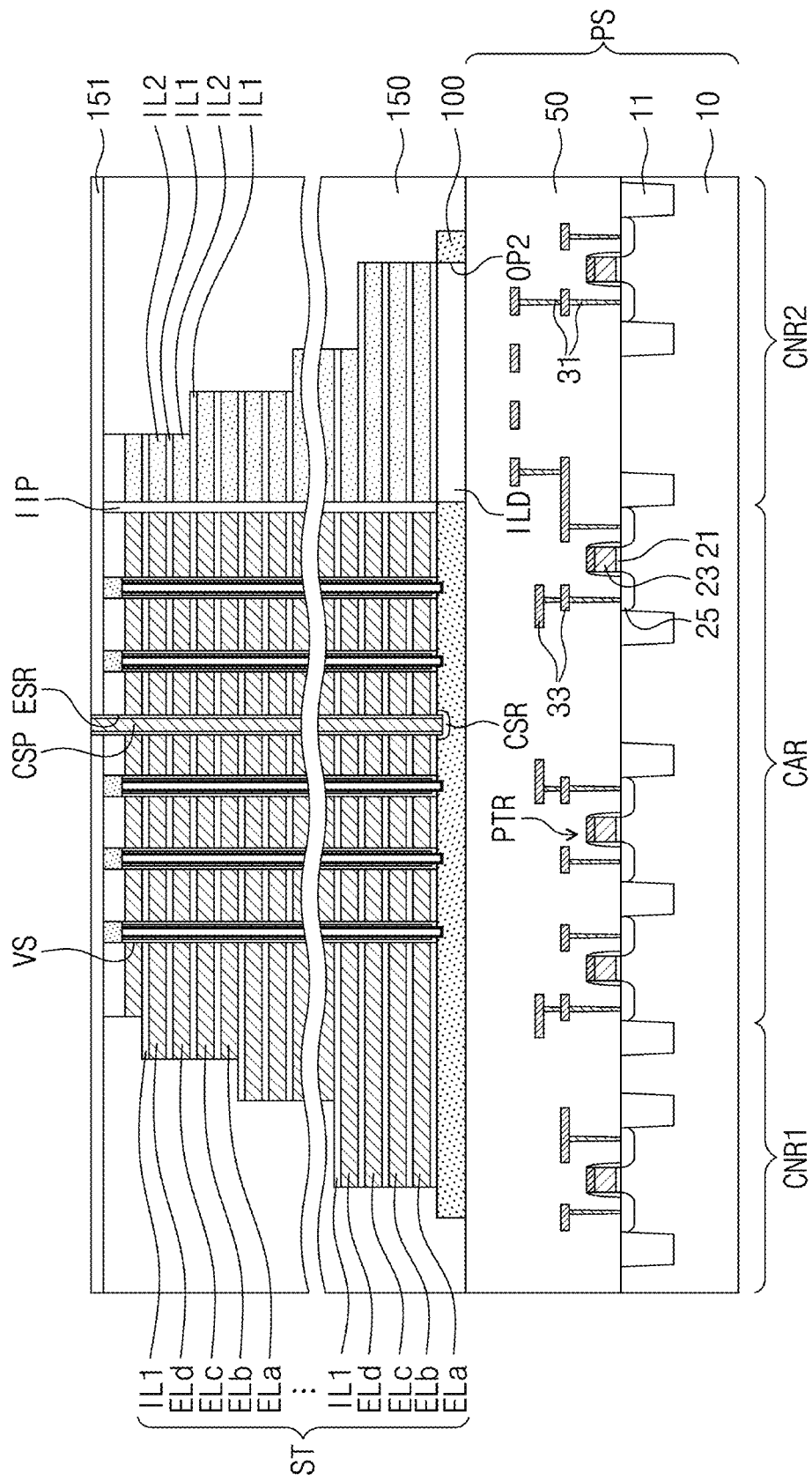
Figure 12B:
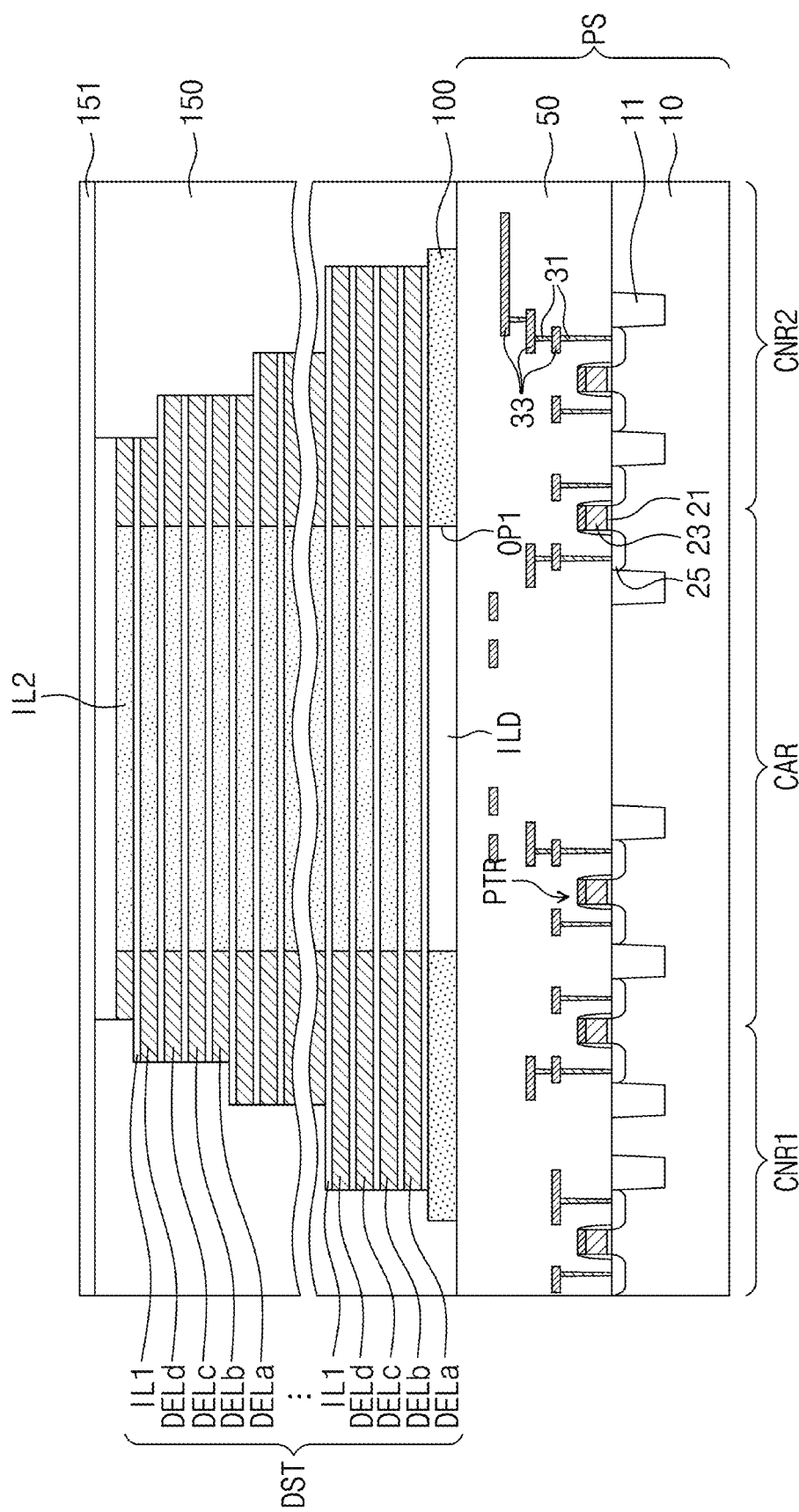

Referring to FIGS. 4, 12A and 12B, horizontal insulating patterns (not shown) and electrode layers may be formed in the recess regions RR, and thus the first and second stack structures ST1 and ST2 and the dummy stack structure DST may be formed on the horizontal semiconductor layer 100.

For example, a horizontal insulating layer, a barrier metal layer (e.g., TiN, TaN, or WN) and a metal layer (e.g., W) may be sequentially formed on the mold structure MS having the recess regions RR, and then, the barrier metal layer and the metal layer outside the recess regions RR may be etched to form the horizontal insulating patterns and the electrode layers. The horizontal insulating pattern may be a portion of a data storage layer of a NAND flash memory device and may include a silicon oxide layer and/or a high-k dielectric layer.

After the formation of the electrode layers, common source regions CSR may be formed in the horizontal semiconductor layer 100 exposed by the electrode separation regions ESR, and then, the electrode separation regions ESR may be filled with an insulating material. For example, the common source regions CSR may include N-type dopants (e.g., arsenic (As) or phosphorus (P)). Subsequently, common source plugs CSP may be formed to penetrate the insulating material filling the electrode separation regions ESR. The common source plugs CSP may be connected to the common source regions CSR.

Referring again to FIGS. 4 and 5A to 5C, a second interlayer insulating layer 152 may be formed on the first interlayer insulating layer 151. Next, a patterning process may be performed on the second and first interlayer insulating layers 152 and 151, the upper filling insulation layer 150, the stack structures ST1 and ST2, and the dummy stack structure DST to form contact holes.

For example, some contact holes may penetrate the first and second interlayer insulating layers 151 and 152 and the dummy stack structure DST to expose the peripheral circuit interconnection lines 33. Other contact holes may penetrate the first and second interlayer insulating layers 151 and 152 and the upper filling insulation layer 150 on the first and second connection regions CNR1 and CNR2 to expose end portions of the electrode layers. Still other contact holes may penetrate the second and first interlayer insulating layers 152 and 151 and the stack structures ST1 and ST2 to expose the peripheral circuit interconnection lines 33. In addition, bit line contact holes may expose the vertical channel structures VS on the cell array region CAR.

Subsequently, the contact holes may be filled with a conductive material to form the contact plugs CPLG, the first through-interconnections PLGa, the second through-interconnections PLGb, the first conductive plugs CPLa, and the second conductive plugs CPLb, described with reference to FIGS. 5A to 5C. Thereafter, the bit lines BL, the conductive lines CL and the first and second conductive lines CLa and CLb described above may be formed on the second interlayer insulating layer 152.

According to the example embodiments of the inventive concepts, the dummy stack structure DST including the through-interconnection region THR2 and the capacitor CR formed by dummy electrodes DELa to DELd that face each other may be disposed between the stack structures ST, and thus the integration density of the 3D semiconductor memory device may be improved and a high capacitance in a limited area may be provided or realized as compared to a memory device in which a capacitor may be separately formed outside a memory cell block.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A three-dimensional (3D) semiconductor memory device comprising:
   first insulating layers vertically stacked on a peripheral logic structure;
   second insulating layers stacked alternately with the first insulating layers;
   conductive layers stacked alternately with the first insulating layers such that the conductive layers are on sidewalls of the second insulating layers;
   through-interconnections penetrating the first insulating layers and the second insulating layers such that the through-interconnections are connected to the peripheral logic structure; and
   a first conductive line electrically connected to a plurality of first conductive layers of the conductive layers functioning as dummy conductive layers such that the plurality of dummy conductive layers and the first conductive line connected thereto form capacitors.

2. The 3D semiconductor memory device of claim 1, further comprising:
   first conductive plugs connected to respective ones of the plurality of first conductive layers, and the first conductive plugs each connected in common to the first conductive line.

3. The 3D semiconductor memory device of claim 1, further comprising:
   a horizontal semiconductor layer between the peripheral logic structure and the first insulating layers, the horizontal semiconductor layer having an opening overlapping with at least a portion of each of the second insulating layers.

4. The 3D semiconductor memory device of claim 1, wherein the conductive layers are at a same level as respective ones of the second insulating layers.

5. The 3D semiconductor memory device of claim 1, wherein the sidewalls of the second insulating layers include a portion having a curved surface shape.

6. The 3D semiconductor memory device of claim 1, wherein the conductive layers surround the sidewalls of respective ones of the second insulating layers when viewed in a plan view.

7. The 3D semiconductor memory device of claim 1, wherein a ratio of an area of a respective one of the second insulating layers to an area of a respective one of the conductive layers increases as a vertical distance from the peripheral logic structure increases.

8. The 3D semiconductor memory device of claim 1, further comprising:
   a second conductive line electrically connected to a plurality of second conductive layers of the conductive layers, the plurality of second conductive layers at different levels from levels of the plurality of first conductive layers.

9. The 3D semiconductor memory device of claim 8, wherein the plurality of first conductive layers and the plurality of second conductive layers are alternately stacked.

10. The 3D semiconductor memory device of claim 8, further comprising:
a plurality of third conductive layers each between a respective one of the plurality of first conductive layers and a respective one of the plurality of second conductive layers, the plurality of third conductive layers being electrically floated.

11. A three-dimensional (3D) semiconductor memory device comprising:
a peripheral logic structure on a substrate;
a horizontal semiconductor layer on the peripheral logic structure, the horizontal semiconductor layer including a first connection region, a second connection region and a cell array region, the cell array region between the first connection region and the second connection region;
first insulating layers vertically stacked on the horizontal semiconductor layer;
second insulating layers stacked alternately with the first insulating layers on the cell array region;
conductive layers stacked alternately with the first insulating layers on the first connection region and the second connection region, the conductive layers being dummy conductive layers;
a conductive line on the first connection region; and
a plurality of conductive plugs electrically connecting the conductive line and the dummy conductive layers to form capacitors.

12. The 3D semiconductor memory device of claim 11, further comprising:
a through-interconnection electrically connecting the conductive line and the peripheral logic structure.

13. The 3D semiconductor memory device of claim 11, wherein the horizontal semiconductor layer has an opening overlapping with at least a portion of each of the second insulating layers.

14. The 3D semiconductor memory device of claim 11, wherein the conductive layers are each at a same level as a respective one of the second insulating layers.

15. The 3D semiconductor memory device of claim 11, wherein a sidewall of the second insulating layers include a portion having a curved surface shape.

16. A three-dimensional (3D) semiconductor memory device comprising:
a horizontal semiconductor layer on a peripheral logic structure, the horizontal semiconductor layer including first and second connection regions and a cell array region between the first and second connection regions;
first and second stack structures on the horizontal semiconductor layer;
a dummy stack structure between the first and second stack structures, the dummy stack structure including dummy electrode layers vertically stacked;
vertical channel structures penetrating the first and second stack structures on the cell array region such that the vertical channel structures are connected to the horizontal semiconductor layer;
first through-interconnections penetrating the dummy stack structure on the cell array region such that the first through-interconnections are connected to the peripheral logic structure;
a conductive line on the dummy electrode layers;
a first conductive plug connecting the conductive line and a first dummy electrode layer of the dummy electrode layers; and
a second conductive plug connecting the conductive line and a second dummy electrode layer of the dummy electrode layers.

17. The 3D semiconductor memory device of claim 16, wherein the conductive line is on a filling insulation layer, the filling insulation layer covering the first and second stack structures and the dummy stack structure.

18. The 3D semiconductor memory device of claim 16, wherein the horizontal semiconductor layer has an opening overlapping with at least a portion of the dummy stack structure on the cell array region.

19. The 3D semiconductor memory device of claim 16, wherein the dummy stack structure further comprises:
first insulating layers stacked alternately with the dummy electrode layers on the cell array region; and
second insulating layers stacked alternately with the first insulating layers on the cell array region.

* * * * *